(12) United States Patent
Feng et al.

(10) Patent No.: US 9,134,464 B2
(45) Date of Patent: *Sep. 15, 2015

(54) FOCUS MODULE AND COMPONENTS WITH ACTUATOR

(71) Applicant: Hand Held Products, Inc., Fort Mill, SC (US)

(72) Inventors: Chen Feng, Bothell, WA (US); Ynjiun P. Wang, Cupertino, CA (US); William H. Havens, Syracuse, NY (US); Jianhua Li, Freemont, CA (US)

(73) Assignee: Hand Held Products, Inc., Fort Mill, SC (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/230,322

(22) Filed: Mar. 31, 2014

(65) Prior Publication Data

US 2014/0197304 A1 Jul. 17, 2014

Related U.S. Application Data

(63) Continuation of application No. 13/245,456, filed on Sep. 26, 2011, now Pat. No. 8,687,282, and a continuation of application No. 11/781,901, filed on Jul. 23, 2007, now Pat. No. 8,027,096.

(60) Provisional application No. 60/875,245, filed on Dec. 15, 2006.

(51) Int. Cl.
*G02B 1/06* (2006.01)
*G02B 3/12* (2006.01)
(Continued)

(52) U.S. Cl.
CPC .... *G02B 3/14* (2013.01); *G02B 7/028* (2013.01); *G02B 26/004* (2013.01); *H01L 27/14625* (2013.01); *G02B 7/36* (2013.01)

(58) Field of Classification Search
CPC .................................. G02B 3/14; G02B 26/004
USPC .................................... 359/665, 666; 235/454
See application file for complete search history.

(56) References Cited

U.S. PATENT DOCUMENTS

| | | | |
|---|---|---|---|
| 1,269,422 A | 6/1918 | Gordon | |
| 2,062,468 A | 12/1936 | Matz | |

(Continued)

FOREIGN PATENT DOCUMENTS

| | | |
|---|---|---|
| CN | 1407353 A | 4/2003 |
| CN | 102436018 A | 5/2012 |

(Continued)

OTHER PUBLICATIONS

AMS-1000 Tunable lens unit, Varioptic, France, 1 page (http://www.varioptic.com/en/products.php?cat-PAMS—Sep. 14, 2005). Previously Submitted in Parent Application.

(Continued)

*Primary Examiner* — William Choi
(74) *Attorney, Agent, or Firm* — Additon, Higgins & Pendleton, P.A.

(57) ABSTRACT

A focus module contains a boundary element and a focus element. The focus element includes a fluid and a deformable membrane, with the fluid being entrapped between the boundary element and the deformable membrane. The focus module also includes a pressure element, which is capable of deforming the focus element by pressing on the deformable membrane in the direction of the boundary element.

20 Claims, 20 Drawing Sheets

(51) Int. Cl.
  *G02B 3/14* (2006.01)
  *G02B 26/00* (2006.01)
  *G02B 7/02* (2006.01)
  *H01L 27/146* (2006.01)
  *G02B 7/36* (2006.01)

(56) References Cited

U.S. PATENT DOCUMENTS

| | | |
|---|---|---|
| 2,300,251 A | 10/1942 | Flint |
| 3,161,718 A | 12/1964 | DeLuca |
| 3,305,291 A | 2/1967 | Alvarez |
| 3,583,790 A | 6/1971 | Baker |
| 3,761,157 A | 9/1973 | Humphrey |
| 3,778,170 A | 12/1973 | Howell et al. |
| 4,134,393 A | 1/1979 | Stark et al. |
| 4,191,594 A | 3/1980 | Stark et al. |
| 4,210,121 A | 7/1980 | Stark |
| 4,249,516 A | 2/1981 | Stark |
| 4,261,655 A | 4/1981 | Honigsbaum |
| 4,289,379 A | 9/1981 | Michelet |
| 4,312,709 A | 1/1982 | Stark et al. |
| 4,407,567 A | 10/1983 | Michelet et al. |
| 4,487,659 A | 12/1984 | Stark |
| 4,514,048 A | 4/1985 | Rogers |
| 4,783,153 A | 11/1988 | Kushibiki et al. |
| 4,783,155 A | 11/1988 | Imataki et al. |
| 4,784,479 A | 11/1988 | Ikemori |
| 4,802,746 A | 2/1989 | Baba et al. |
| 4,818,847 A | 4/1989 | Hara et al. |
| 5,091,801 A | 2/1992 | Ebstein |
| 5,113,445 A | 5/1992 | Wang |
| 5,150,234 A | 9/1992 | Takahashi et al. |
| 5,199,084 A | 3/1993 | Kishi et al. |
| 5,243,655 A | 9/1993 | Wang |
| 5,278,399 A | 1/1994 | Sano |
| 5,291,243 A | 3/1994 | Heckman et al. |
| 5,305,356 A | 4/1994 | Brooks et al. |
| 5,307,423 A | 4/1994 | Gupta et al. |
| 5,317,388 A | 5/1994 | Surka et al. |
| 5,331,176 A | 7/1994 | Sant' Anselmo et al. |
| 5,337,361 A | 8/1994 | Wang et al. |
| 5,389,222 A | 2/1995 | Shahinpoor |
| 5,393,965 A | 2/1995 | Bravman et al. |
| 5,396,144 A | 3/1995 | Gupta et al. |
| 5,401,944 A | 3/1995 | Bravman et al. |
| 5,428,212 A | 6/1995 | Tani et al. |
| 5,471,533 A | 11/1995 | Wang et al. |
| 5,489,158 A | 2/1996 | Wang et al. |
| 5,513,264 A | 4/1996 | Wang et al. |
| 5,579,487 A | 11/1996 | Meyerson et al. |
| 5,646,389 A | 7/1997 | Bravman et al. |
| 5,659,167 A | 8/1997 | Wang et al. |
| 5,684,637 A | 11/1997 | Floyd |
| 5,710,419 A | 1/1998 | Wang et al. |
| 5,734,153 A | 3/1998 | Swartz et al. |
| 5,742,263 A | 4/1998 | Wang et al. |
| 5,793,033 A | 8/1998 | Feng et al. |
| 5,818,023 A | 10/1998 | Meyerson et al. |
| 5,834,754 A | 11/1998 | Feng et al. |
| 5,841,121 A | 11/1998 | Koenck |
| 5,866,888 A | 2/1999 | Bravman et al. |
| 5,877,487 A | 3/1999 | Tani et al. |
| 5,880,453 A | 3/1999 | Wang et al. |
| 5,892,625 A | 4/1999 | Heimer |
| 5,917,171 A | 6/1999 | Sasai |
| 5,917,657 A | 6/1999 | Kaneko et al. |
| 5,917,913 A | 6/1999 | Wang |
| 5,973,852 A | 10/1999 | Task |
| 6,081,388 A | 6/2000 | Widl |
| 6,109,852 A | 8/2000 | Shahinpoor et al. |
| 6,123,261 A | 9/2000 | Roustaei |
| 6,123,263 A | 9/2000 | Feng |
| 6,175,922 B1 | 1/2001 | Wang |
| 6,188,526 B1 | 2/2001 | Sasaya et al. |
| 6,212,015 B1 | 4/2001 | Heimer |
| 6,282,656 B1 | 8/2001 | Wang |
| 6,368,954 B1 | 4/2002 | Lopatin et al. |
| 6,369,954 B1 | 4/2002 | Berge et al. |
| 6,376,971 B1 | 4/2002 | Pelrine et al. |
| 6,399,954 B1 | 6/2002 | Seto et al. |
| 6,437,925 B1 | 8/2002 | Nishioka |
| 6,449,081 B1 | 9/2002 | Onuki et al. |
| 6,475,639 B2 | 11/2002 | Shahinpoor et al. |
| 6,512,218 B1 | 1/2003 | Canini et al. |
| 6,529,620 B2 | 3/2003 | Thompson |
| 6,538,823 B2 | 3/2003 | Kroupenkine et al. |
| 6,542,309 B2 | 4/2003 | Guy |
| 6,545,815 B2 | 4/2003 | Kroupenkine et al. |
| 6,545,816 B1 | 4/2003 | Kroupenkine et al. |
| 6,586,859 B2 | 7/2003 | Kornbluh et al. |
| 6,594,759 B1 | 7/2003 | Wang |
| 6,628,040 B2 | 9/2003 | Pelrine et al. |
| 6,669,093 B1 | 12/2003 | Meyerson et al. |
| 6,702,483 B2 | 3/2004 | Tsuboi et al. |
| 6,715,876 B2 | 4/2004 | Floyd |
| 6,723,929 B2 | 4/2004 | Kent |
| 6,743,903 B1 | 6/2004 | Gordon et al. |
| 6,747,806 B2 | 6/2004 | Gelbart |
| 6,762,210 B1 | 7/2004 | Oguro et al. |
| 6,806,621 B2 | 10/2004 | Heim et al. |
| 6,806,988 B2 | 10/2004 | Onuki et al. |
| 6,808,114 B1 | 10/2004 | Palestini et al. |
| 6,809,462 B2 | 10/2004 | Pelrine et al. |
| 6,812,624 B1 | 11/2004 | Pei et al. |
| 6,832,725 B2 | 12/2004 | Gardiner et al. |
| 6,850,916 B1 | 2/2005 | Wang |
| 6,882,086 B2 | 4/2005 | Kornbluh et al. |
| 6,889,904 B2 | 5/2005 | Bianculli et al. |
| 6,891,317 B2 | 5/2005 | Pei et al. |
| 6,934,090 B2 | 8/2005 | Nagaoka et al. |
| 6,936,809 B2 | 8/2005 | Viinikanoja |
| 7,018,862 B2 | 3/2006 | Yao et al. |
| 7,027,683 B2 | 4/2006 | O'Connor et al. |
| 7,043,153 B2 | 5/2006 | Takeyama et al. |
| 7,064,472 B2 | 6/2006 | Pelrine et al. |
| 7,065,344 B2 | 6/2006 | O'Hagan et al. |
| 7,089,214 B2 | 8/2006 | Wang |
| 7,107,246 B2 | 9/2006 | Wang |
| 7,169,822 B2 | 1/2007 | Oguro et al. |
| 7,193,794 B2 | 3/2007 | Beck et al. |
| 7,224,106 B2 | 5/2007 | Pei et al. |
| 7,270,274 B2 | 9/2007 | Hennick et al. |
| RE39,874 E | 10/2007 | Berge et al. |
| 7,293,712 B2 | 11/2007 | Wang |
| 7,296,749 B2 | 11/2007 | Massieu |
| 7,296,751 B2 | 11/2007 | Barber et al. |
| 7,364,081 B2 | 4/2008 | Havens et al. |
| 7,416,125 B2 | 8/2008 | Wang et al. |
| 7,433,586 B2 | 10/2008 | Onozawa |
| 7,440,193 B2 | 10/2008 | Gunasekaran et al. |
| 7,533,824 B2 | 5/2009 | Hennick et al. |
| 7,568,628 B2 | 8/2009 | Wang et al. |
| 7,611,060 B2 | 11/2009 | Wang et al. |
| 7,635,084 B2 | 12/2009 | Wang et al. |
| 7,671,514 B2 | 3/2010 | Lee et al. |
| 7,717,343 B2 | 5/2010 | Havens et al. |
| 7,744,646 B2 | 6/2010 | Zadno-Azizi et al. |
| 7,813,047 B2 | 10/2010 | Wang et al. |
| 7,826,144 B2 | 11/2010 | Mescher |
| 7,878,403 B2 | 2/2011 | Hennick et al. |
| 7,896,249 B2 | 3/2011 | Perreault |
| 7,909,257 B2 | 3/2011 | Wang et al. |
| 7,918,398 B2 | 4/2011 | Li et al. |
| 7,922,088 B2 | 4/2011 | Wang |
| 7,946,493 B2 | 5/2011 | Havens et al. |
| 8,016,189 B2 | 9/2011 | Wang et al. |
| 8,027,095 B2 | 9/2011 | Havens |
| 8,027,096 B2 | 9/2011 | Feng et al. |
| 8,038,066 B2 | 10/2011 | Havens et al. |
| 8,083,148 B2 | 12/2011 | Wang et al. |
| 8,146,820 B2 | 4/2012 | Wang et al. |
| 8,181,338 B2 | 5/2012 | Benslimane et al. |
| 8,196,842 B2 | 6/2012 | Wang |
| 8,225,089 B2 | 7/2012 | Wang et al. |

(56) References Cited

U.S. PATENT DOCUMENTS

| | | | |
|---|---|---|---|
| 8,226,009 | B2 | 7/2012 | Havens et al. |
| 8,256,678 | B2 | 9/2012 | Havens et al. |
| 8,261,992 | B2 | 9/2012 | Havens et al. |
| 8,282,004 | B2 | 10/2012 | Wang et al. |
| 8,292,183 | B2 | 10/2012 | Li et al. |
| 8,305,691 | B2 | 11/2012 | Havens et al. |
| 8,333,323 | B2 | 12/2012 | Richardson et al. |
| 8,366,002 | B2 | 2/2013 | Wang et al. |
| 8,505,822 | B2 | 8/2013 | Wang et al. |
| 8,596,543 | B2 | 12/2013 | Havens et al. |
| 8,687,282 | B2 * | 4/2014 | Feng et al. .......... 359/666 |
| 2002/0066851 | A1 | 6/2002 | Hennick et al. |
| 2005/0002113 | A1 | 1/2005 | Berge |
| 2006/0076540 | A1 | 4/2006 | Zama et al. |
| 2007/0030573 | A1 | 2/2007 | Batchko et al. |
| 2007/0063048 | A1 | 3/2007 | Havens et al. |
| 2007/0106377 | A1 | 5/2007 | Smith et al. |
| 2007/0156021 | A1 | 7/2007 | Morse et al. |
| 2008/0245872 | A1 | 10/2008 | Good |
| 2009/0072037 | A1 | 3/2009 | Good et al. |
| 2009/0086331 | A1 | 4/2009 | Gunasekaran et al. |
| 2009/0108072 | A1 | 4/2009 | Wang |
| 2011/0036908 | A1 | 2/2011 | Havens et al. |
| 2011/0163165 | A1 | 7/2011 | Liu et al. |
| 2011/0163166 | A1 | 7/2011 | Wang et al. |
| 2012/0248195 | A1 | 10/2012 | Feng et al. |
| 2014/0168787 | A1 | 6/2014 | Wang |

FOREIGN PATENT DOCUMENTS

| | | | |
|---|---|---|---|
| DE | 19706274 | A1 | 8/1997 |
| DE | 3644225 | A1 | 7/1998 |
| DE | 102005013889 | A1 | 10/2005 |
| EP | 1674892 | A1 | 6/2006 |
| EP | 2007862981 | A2 | 8/2009 |
| GB | 1327503 | A | 8/1973 |
| JP | 60114802 | A | 6/1985 |
| JP | 62148903 | A | 7/1987 |
| JP | 1140118 | A | 6/1989 |
| JP | 02012518 | A | 1/1990 |
| JP | 3206420 | A | 9/1991 |
| JP | 9230252 | A | 9/1997 |
| JP | 2002243918 | A | 8/2002 |
| JP | 2005283750 | A | 10/2005 |
| JP | 2006058405 | A | 3/2006 |
| JP | 2010157222 | A | 7/2010 |
| JP | 2010170561 | A | 8/2010 |
| WO | 9638744 | A1 | 12/1996 |
| WO | 9918456 | A1 | 4/1999 |
| WO | 9918546 | A1 | 4/1999 |
| WO | 0058763 | A1 | 10/2000 |
| WO | 0122148 | A1 | 3/2001 |
| WO | 03044588 | A1 | 5/2003 |
| WO | 03069380 | A1 | 8/2003 |
| WO | 03071335 | A1 | 8/2003 |
| WO | 2004027489 | A1 | 4/2004 |
| WO | 2004038480 | A1 | 5/2004 |
| WO | 2004050334 | A1 | 6/2004 |
| WO | 2004051323 | A1 | 6/2004 |
| WO | 2004072689 | A2 | 8/2004 |
| WO | 2004077126 | A1 | 9/2004 |
| WO | 2004097495 | A1 | 11/2004 |
| WO | 2004099830 | A1 | 11/2004 |
| WO | 2004099844 | A1 | 11/2004 |
| WO | 2004099845 | A1 | 11/2004 |
| WO | 2004102250 | A1 | 11/2004 |
| WO | 2004102252 | A1 | 11/2004 |
| WO | 2004102253 | A1 | 11/2004 |
| WO | 2005003842 | A1 | 1/2005 |
| WO | 2005003843 | A1 | 1/2005 |
| WO | 2005006029 | A1 | 1/2005 |
| WO | 2005006312 | A1 | 1/2005 |
| WO | 2005069042 | A1 | 7/2005 |
| WO | 2005069043 | A1 | 7/2005 |
| WO | 2005069044 | A1 | 7/2005 |
| WO | 2005071359 | A1 | 8/2005 |
| WO | 2005073762 | A1 | 8/2005 |
| WO | 2006121659 | A1 | 11/2006 |
| WO | 2004099829 | A2 | 11/2007 |
| WO | 2008076399 | A2 | 6/2008 |

OTHER PUBLICATIONS

Arora, S. Ghosh, T., and Muth, J. "Dielectric elastomer based prototype fiber actuators," Sensors and Actuators A: Physical, 136:1, pp. 321-328 (May 2007). Previously Submitted in Parent Application.

Bal, Abdullah et al., Improved fingerprint Identification with supervised filtering enhancement, Applied Optics, Feb. 10, 2005, pp. 647-654, vol. 44, No. 5, Optical Society of America. Previously Submitted in Parent Application.

Berge, B. et al., Variable focal lens controlled by an external voltage: An application of electrowetting, The European Physical Journal E, Dec. 1, 1999, pp. 159-163. Previously Submitted in Parent Application.

Chronis N, Liu GL, Jeong K-H, and Lee LP, 2003, "Tunable liquid-filled microlens array integrated with microfluidic network," Optics Express 11(19):2370-2378. Previously Submitted in Parent Application.

Conductive Elastomer Sheet Stock, Chomerics, 3 pages (www.chomerics.com) Previously Submitted in Parent Application.

Ghosh TK, Kotek R, and Muth J, 2005, "Development of layered functional fiber based micro-tubes," National Textile Center Annual Report 1-9. Previously Submitted in Parent Application.

ICM105T VGA CMOS image sensor (Data Sheet), IC Media, May 2004, 17 pages. Previously Submitted in Parent Application.

International Search Report for PCT/US2007/025707, dated Aug. 19, 2008, 7 pages. Previously Submitted in Parent Application.

Introducing a CMOS Image Sensor Specifically Designed for Automotive Scene—Understanding Systems, Micron, 2 pages (www.micron.com—Oct 2, 2004). Previously Submitted in Parent Application.

Invitation to Pay Additional Fees and Communication Relating to the Results of the partial International Search for PCT/US2007/025707, 4 pages, dated Jun. 4, 2008. Previously Submitted in Parent Application.

Kuiper, S. et al., Variable-focus lens for miniature cameras, Applied Physics Letters, Aug. 16, 2004, pp. 1128-1130, vol. 85, No. 7, American Institute of Physics. Previously Submitted in Parent Application.

Levy, Eli et al., Modulation transfer function of a lens measured with a random target method, Applied Optics, Feb. 1, 1999, pp. 679-683, vol. 38, No. 4, Optical Society of America. Previously Submitted in Parent Application.

Liquid Lens Mimics the Human Eye (Press Release), Agency for Science, Techology and Research, 5 pages. Previously Submitted in Parent Application.

Mugele, Frieder et al., Electrowetting: from basics to applications, Journal of Physics: Condensed Matter, J. Phys. Condens, Matter 17 (2005), pp. R705-R774, JOP Publishing Ltd., UK. Previously Submitted in Parent Application.

Narryanswamy, Ramkumar et al., Extending the imaging volume for biometric iris recognition, Applied Optics, Feb. 10, 2005, pp. 701-712, vol. 44, No. 5, Optical Society of America. Previously Submitted in Parent Application.

WIPO, International Preliminary Report on Patentability for PCT/US2007/025707, dated Jun. 16, 2009 (1 p.). Previously Submitted in Parent Application.

WIPO, Written Opinion of International Searching Authority for PCT/US2007/025707, dated Jun. 16, 2009 (9 pp.). Previously Submitted in Parent Application.

PCT Application No. 2007/800514041 filed Dec. 14, 2007. Title: Apparatus and Method Comprising Deformable Lens Element. Previously Submitted in Parent Application.

PCT Application No. 2009/541411 filed Jun. 15, 2009. Title: Apparatus and Method Comprising Deformable Lens Element. Previously Submitted in Parent Application.

(56) References Cited

OTHER PUBLICATIONS

Pelrine R. Kornbluh RD, Pei Q, Stanford S., Oh S, Eckerle, J. Full RJ, Rosenthal MA, and Meijer K, 2002, "Dielectric elastomer artificial muscle actuators: toward biomimetic motion," Proc. SPIE 4695: 126-137. Previously Submitted in Parent Application.

Philips' Fluid Lenses Bring Things into Focus, Philips' Fluid Lenses: Digital Photography Review, 3 pp (http://www.dpreview.com/news/article_printasp?date=0403&article=04030302 philipsfluid . . .—Sep. 14, 2005). Previously Submitted in Parent Application.

Ren H., Fox D., Anderson A., Wu B., and Wu S-T, 2006, "Tunable-focus liquid lens controlled using a servo motor" Optics Express 14(18):8031-8036. Previously Submitted in Parent Application.

Santiago-Alvarado A., Gonzalez-Garcia J, Garcia-Luna J, Fernandez-Moreno A, and Vera-Diaz W, 2006, "Analysis and design of an adaptive lens," Proceedings of SPIE Optics and Photonics 6288.62880S-1-62880S-8. Previously Submitted in Parent Application.

Smith, Warren J., Modern Optical Engineering the Design of Optical Systems, McGraw-Hill Book Company, pp. 58-59. Previously Submitted in Parent Application.

Written Opinion of the International Searching Authority for PCT/US2007/025707, dated Aug. 19, 2008, 10 pp. Previously Submitted in Parent Application.

Examination Phase in Chinese Patent Application No. 201110437420.2, with translation. Previously Submitted in Parent Application.

May 25, 2012, Communication pursuant to Article 94(3) EPC in European Application No. 07862984.3. Previously Submitted in Parent Application.

* cited by examiner

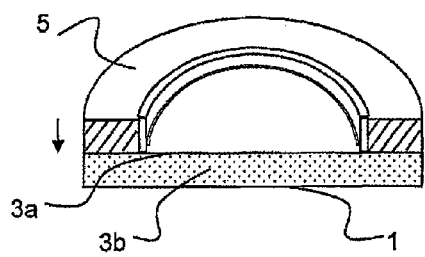
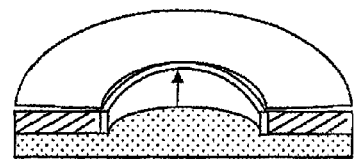
FIG. 4a    FIG. 4b
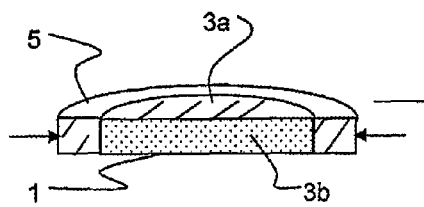
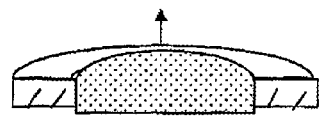
FIG. 5a    FIG. 5b
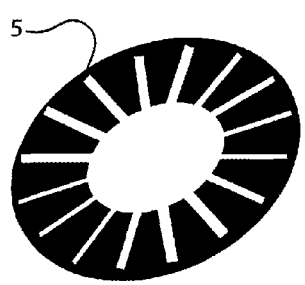
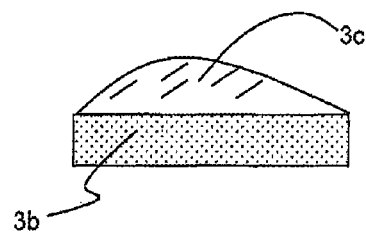
FIG. 6    FIG. 7

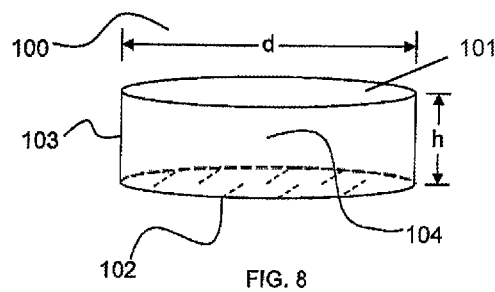
FIG. 8
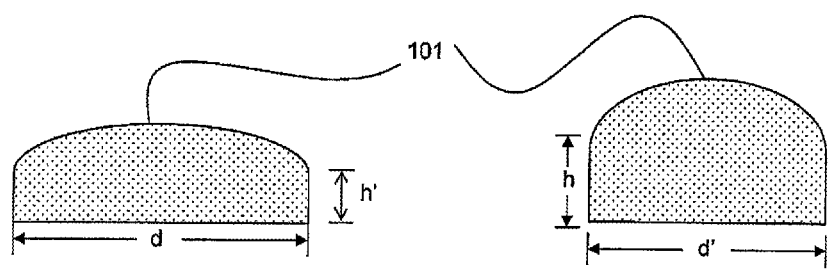
FIG. 9
FIG. 10
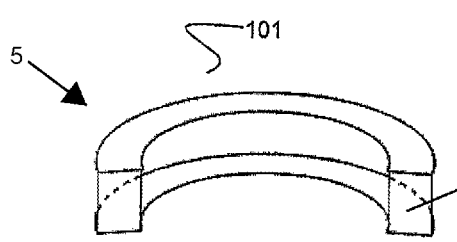
FIG. 11a
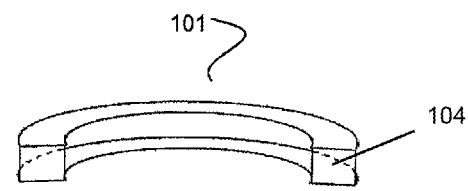
FIG. 11b
FIG. 11c

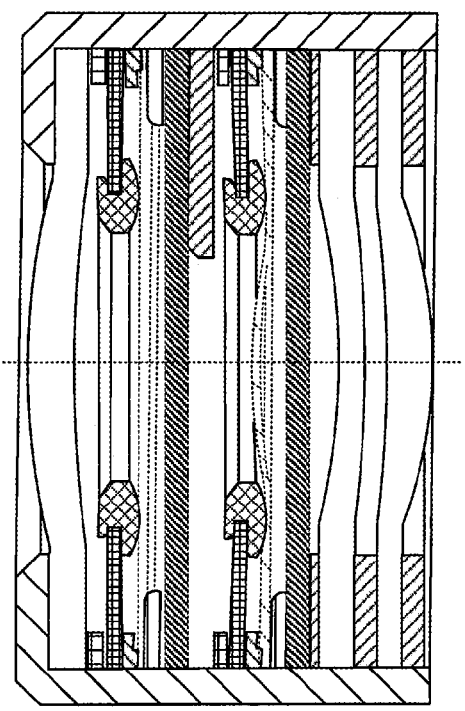
FIG. 14
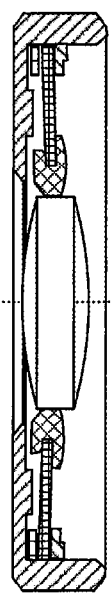 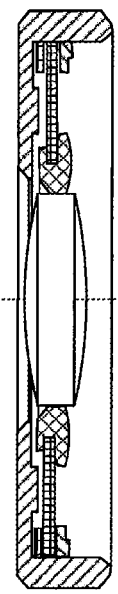
FIG. 15a FIG. 15b

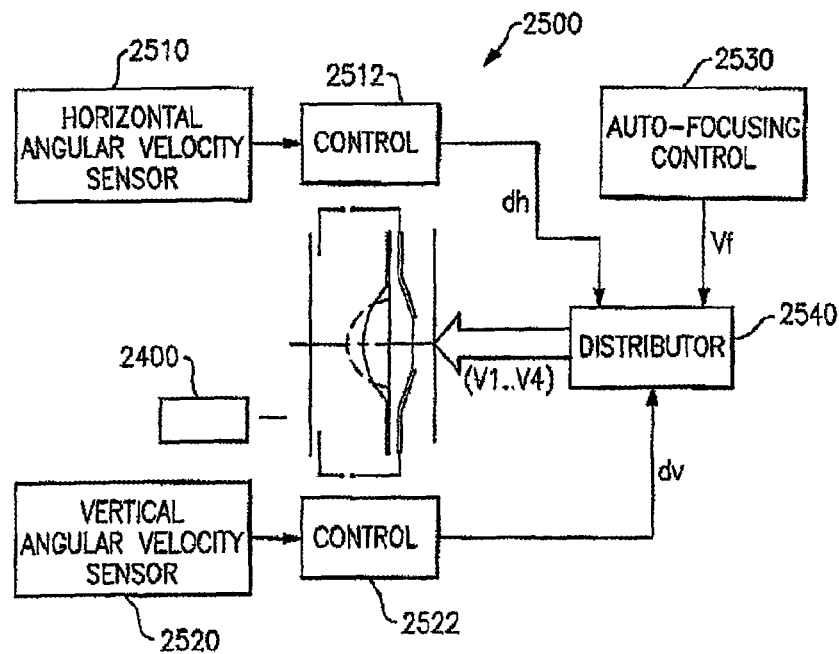
FIG. 32
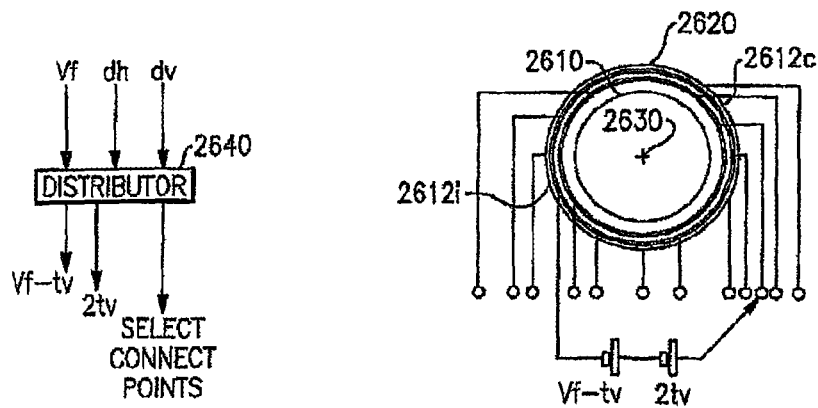
FIG. 33B
FIG. 33A

FOCUS MODULE AND COMPONENTS WITH ACTUATOR

CROSS-REFERENCE TO RELATED APPLICATIONS

This application claims the benefit of U.S. patent application Ser. No. 13/245,456 for a Focus Module and Components with Actuator filed Sep. 26, 2011 (and published Oct. 4, 2012 as U.S. Patent Application Publication No. 2012/0248195), now U.S. Pat. No. 8,687,282, which is a continuation of U.S. patent application Ser. No. 11/781,901 for a Focus Module and Components with Actuator Polymer Control filed Jul. 23, 2007 (and published Jun. 19, 2008 as U.S. Patent Application Publication No. 2008/0144186), now U.S. Pat. No. 8,027,096, which claims the benefit of U.S. Patent Application No. 60/875,245 for a Focus Module and Components with Actuator Polymer Control filed Dec. 15, 2006. Each of the foregoing patent applications, patent publications, and patents is hereby incorporated by reference in its entirety.

U.S. patent application Ser. No. 11/897,924 for an Apparatus and Method Comprising Deformable Lens Element filed Aug. 31, 2007 (and published Jun. 19, 2008 as U.S. Patent Application Publication No. 2008/0144185), now U.S. Pat. No. 7,813,047, also claims the benefit of U.S. Patent Application No. 60/875,245 as well as U.S. Patent Application No. 60/961,036 for Variable Lens Elements and Modules filed Jul. 18, 2007. U.S. patent application Ser. No. 12/901,242 for an Apparatus and Method Comprising Deformable Lens Element filed Oct. 8, 2010 (and published Jan. 27, 2011 as U.S. Patent Application Publication No. 2011/0017829), now U.S. Pat. No. 8,505,822, also claims the benefit of U.S. Patent Application No. 60/875,245 as well as U.S. Patent Application No. 60/961,036. U.S. patent application Ser. No. 13/964,801 for an Apparatus and Method Comprising Deformable Lens Element filed Aug. 12, 2013 also claims the benefit of U.S. Patent Application No. 60/875,245 as well as U.S. Patent Application No. 60/961,036. International Application No. PCT/US07/25707 for an Apparatus and Method Comprising Deformable Lens Element filed Dec. 14, 2007 (and published Jun. 26, 2008 as WIPO Publication No. WO 2008/076399) also claims the benefit of U.S. Patent Application No. 60/875,245 as well as U.S. Patent Application No. 60/961,036. Each of the foregoing patent applications, patent publications, and patents is hereby incorporated by reference in its entirety.

U.S. patent application Ser. No. 11/781,901 is related to U.S. Patent Application No. 60/778,569 for a Data Reading Apparatus Having an Adaptive Lens filed Mar. 2, 2006. The foregoing patent application is hereby incorporated by reference in its entirety.

U.S. patent application Ser. No. 11/781,901 is also related to U.S. patent application Ser. No. 11/521,142 for a Data Reader Apparatus Having an Adaptive Lens filed Sep. 14, 2006 (and published Mar. 22, 2007 as U.S. Patent Application Publication No. 2007/0063048), which claims the benefit of U.S. Patent Application No. 60/725,531 for a Data Reader Apparatus Having an Adaptive Lens filed Oct. 11, 2005 as well as U.S. Patent Application No. 60/717,583 for an Apparatus Comprising a Fluid Lens filed Sep. 14, 2005. U.S. patent application Ser. No. 11/521,172 for a Remote Imaging Apparatus Having an Adaptive Lens filed Sep. 14, 2006 (and published Jul. 5, 2007 as U.S. Patent Application Publication No. 2007/0156021) also claims the benefit of U.S. Patent Application No. 60/717,583. International Application No. PCT/US06/35853 for a Medical Apparatus Comprising an Adaptive Lens filed Sep. 14, 2006 (and published Mar. 22, 2007 as WIPO Publication No. WO 2007/033326 also claims the benefit of U.S. Patent Application No. 60/717,583. Each of the foregoing patent applications, patent publications, and patents is hereby incorporated by reference in its entirety.

U.S. patent application Ser. No. 11/781,901 is also related to U.S. patent application Ser. No. 11/546,531 for Control Systems for Adaptive Lens filed Oct. 11, 2006 (and published Apr. 12, 2007 as U.S. Patent Application Publication No. 2007/0080280), now U.S. Pat. No. 8,027,095. Each of the foregoing patent application, patent publication, and patent is hereby incorporated by reference in its entirety.

FIELD OF THE INVENTION

The invention relates generally to focus modules, and more specifically to focus modules in which focus control involves use of an actuator.

BACKGROUND

In brief, a fluid lens, sometimes also referred to as an adaptive lens, comprises an interface between two fluids having dissimilar optical indices. The shape of the interface can be changed by the application of external forces so that light passing across the interface can be directed to propagate in desired directions. As a result, the optical characteristics of a fluid lens, such as whether the lens operates as a diverging lens or as a converging lens, and its focal length, can be changed in response to the applied forces.

Fluid lens technology that employs electrical signals to control the operation of the fluid lens has been described variously in Matz, U.S. Pat. No. 2,062,468; Berge et al., U.S. Pat. No. 6,369,954; Onuki et al., U.S. Pat. No. 6,449,081; Tsuboi et al., U.S. Pat. No. 6,702,483; Onuki et al., U.S. Pat. No. 6,806,988; Nagaoka et al., U.S. Patent Application Publication No. 2004/0218283; Takeyama et al., U.S. Patent Application Publication No. 2004/0228003; and Berge, U.S. Patent Application Publication No. 2005/0002113, as well as International Patent Application Publications Nos. WO 99/18546, WO 00/58763, and WO 03/069380.

Additional methods of controlling the operation of fluid lenses include the use of liquid crystal material (Nishioka, U.S. Pat. No. 6,437,925), the application of pressure (Widl, U.S. Pat. No. 6,081,388), the use of elastomeric materials in reconfigurable lenses (Rogers, U.S. Pat. No. 4,514,048), and the uses of micro-electromechanical systems (also known by the acronym "MEMS") (Gelbart, U.S. Pat. No. 6,747,806).

Further attempts to develop fluid lens control modules may be seen in, for example, Sasaya et al., U.S. Pat. No. 6,188,526; de Luca, U.S. Pat. No. 3,161,718; Flint, U.S. Pat. No. 2,300,251; Yao et al., U.S. Patent Application Publication No. 2005/0014306; O'Connor et al., U.S. Patent Application Publication No. 2005/0100270; Massieu, U.S. Patent Application Publication No. 2005/0218231; Michelet, U.S. Pat. No. 4,289,379; Viinikanoja, U.S. Pat. No. 6,936,809; European Patent Application EP 1 674 892 A1; British Patent Specification GB 1327503; Japanese Patent No. JP2002243918 (Olympus Optical, Application No. JP20010037454); and International Patent Application Publication No. WO 03/071335.

Further examples include Shahinpoor, U.S. Pat. No. 5,389,222; Shahinpoor et al., U.S. Pat. No. 6,109,852; Guy, U.S. Pat. No. 6,542,309; Pelrine et al., U.S. Pat. No. 6,376,971; Ren H., Fox D., Anderson A., Wu B., and Wu S-T, 2006, "Tunable-focus liquid lens controlled using a servo motor", Optics Express 14(18):8031-8036; Santiago-Alvarado A, González-Garcí a J, García-Luna J, Fernández-Moreno A, and Vera-Díaz W, 2006, "Analysis and design of an adaptive lens", Proceedings of SPIE Optics and Photonics 6288: 62880S-1-62880S-8; Ghosh T K, Kotek R, and Muth J, 2005, "Development of layered functional fiber based microtubes", National Textile Center Annual Report 1-9; Pelrine R, Kornbluh R D, Pei Q, Stanford S, Oh S, Eckerle, J, Full R J, Rosenthal M A, and Meijer K, 2002, "Dielectric elastomer artificial muscle actuators: toward biomimetic motion", Proc. SPIE 4695:126-137; Chronis N, Liu G L, Jeong K-H, and Lee L P, 2003, "Tunable liquid-filled microlens array integrated with microfluidic network", Optics Express 11(19):2370-2378; each of which is incorporated herein by reference in its entirety.

However, there is a continuing need for improved systems and methods for using fluid lenses in present day systems.

BRIEF DESCRIPTION OF THE DRAWINGS

The objects and features of the invention can be better understood with reference to the drawings described below, and the claims. The drawings are not necessarily to scale, emphasis instead generally being placed upon illustrating the principles of the invention. In the drawings, like numerals are used to indicate like parts throughout the various views.

FIGS. 4a and 4b show the effect of pressure exerted on the focus membrane in a direction substantially normal to the plane of the focus membrane;

FIGS. 5a and 5b show the effect of pressure exerted on the focus membrane in a direction substantially parallel to the plane of the focus membrane;

FIG. 6 is a view of the deforming element;

FIG. 7 shows the focus fluid having a non-symmetric meniscus;

FIG. 8 shows a cylindrical component of the focus module;

FIG. 9 is a side perspective showing convex distortion of the top surface of a cylinder having a fluid interior volume in response to a reduction in height of the cylinder;

FIG. 10 is a side perspective showing convex distortion of the top surface of a cylinder having a fluid interior volume in response to a reduction in diameter of the cylinder;

FIGS. 11a and 11b illustrate the deforming element as it deforms from the initial shape shown in FIG. 11a to that in FIG. 11b by vertical contraction/horizontal elongation;

FIG. 11c shows the deforming element assuming a funnel-like shape;

FIG. 14 shows a lens assembly incorporating multiple deformable focus membranes;

FIGS. 15a and 15b show a conventional lens with an electro-actuated polymer deforming element;

FIG. 32 is a schematic diagram showing the relationships between a fluid lens and various components that allow adjustment of the optical axis direction;

FIG. 33a is a schematic diagram of an alternative embodiment of a fluid lens;

FIG. 33b is a schematic diagram of an alternative embodiment of a distributor module;

DETAILED DESCRIPTION

Figure 1:
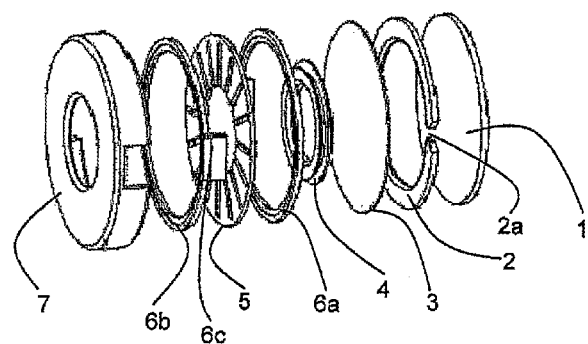
FIG. 1 is an exploded view of one embodiment of a focus module.

The present invention provides a focus module for use in a fluid lens that in particular has few moving parts and does not require the presence of multiple chambers or reservoirs for the fluid component of the lens.

More particularly, the present invention is directed to a focus module which may include the following elements:
1) a boundary element, which may be rigid (such as glass or plastic) or deformable (such as elastomer);
2) a spacer element, interposed between the boundary element and focus element;

3) a focus element, deformable in at least one dimension (such as a fluid or elastomer);
4) a pressure element, which transmits force from the deforming element to the focus element;
5) a deforming or actuator element (such as artificial muscle or electrically actuated polymer) to act upon the focus element;
6) a conductor element for conducting an electrical signal or stimulus to the deforming element;
7) a housing element to provide a physical housing or anchor for the assembly; and
8) a power source, generally located external to the focus module, for powering the conductor element.

As will be explained further herein, not all of these elements are required for an operable focus module. For example, the deforming element may also function as the spacer element; the spacer element may be omitted, as when the lens is provided by use of a unitary fluid-filled element as discussed herein below; the pressure element may be omitted, with the deforming element acting directly on the focus element; and the housing element is essentially a container into which the other elements may be placed, or in which they may be assembled, and whose function may be provided by other structural elements in the apparatus or device in which the focus module is to function.

The boundary element may be rigid, such as glass or plastic, or deformable, such as an elastomer. When it is desired that the boundary element not undergo any deformation as a result of deforming force being applied to the focus element, it is sufficient if the elasticity of the boundary element is such that the boundary element will not deform in response to the force or energy that will be communicated to it when the focus element is at maximum deformation. For example, if the focus module includes a boundary element, spacer element, and focus element, with the focus element comprising a fluid and a deformable membrane where the fluid is entrapped between the boundary element and the membrane; and, a pressure element is used to deform the focus element by exerting pressure on the fluid, whether by pressing on the membrane in the direction of the boundary element or by decreasing the diameter of the fluid space between the boundary element and the membrane (for example, by annular tightening); if it is desired that the boundary element not deform, then it should be sufficiently rigid to remain planar when the pressure element is exerting maximum pressure on the fluid. In other words, when it is desired that the boundary element not deform during operation of the focus module, it is necessary only that the boundary element not deform under such conditions, and not that it be completely rigid or incapable or deforming.

As stated, glass may be used, and a variety of optical glass materials are commercially available, including, for example, Corning® EAGLE2000™ Display Grade glass, available from Corning Display Technologies, Corning, N.Y. USA, and N-BK7 glass, available from Schott North America. Inc., Duryea, Pa. USA. The boundary element may be any suitable thickness, including from about 0.1 mm to about 1 mm, for example, 0.2, 0.3, or 0.4 mm.

The spacer element may be any of a variety of materials, including metal, plastic, and ceramic, depending on its desired functionality. When that functionality is limited to spacing the boundary element from the focus element it may be any material that is compatible with the other materials it will contact, including the focus fluid, such as stainless steel. When it is also desired to provide a seal between itself and the boundary element and/or the focus element, the spacer may be a two-sided tape. When it is desired to serve as the deforming or actuator element it may be an artificial muscle or electro-actuated polymer as discussed further herein. When the spacer element is desired to both seal to the boundary and/or focus elements and serve as the deforming or actuator element, it may be a double sided tape that additionally provides a deforming or actuator function in response to electrical stimuli; for example, a 3M™ VHB™ tape such as Double Coated Acrylic Tape 4910, available from a number of distributors, including Hillas Packaging, Inc., Fort Worth, Tex., USA.

In order to facilitate filling of the fluid chamber with focus fluid, a gap or port may be present in the spacer element, shown in FIG. 1 as element 2a. After the fluid chamber has been filled with focus fluid, this gap or port may be sealed by any means that will both prevent fluid from escaping the chamber, and will withstand the pressure subsequently exerted by the focus fluid as in response to actuation of the deforming element. For example, an epoxy adhesive may be used to provide this seal.

The focus element may be a single component, such as a fluid-filled-filled elastomer, polymer, or plastic; for example, a transparent oil-filled elastomer material which has an elastic memory. Alternatively, the focus element may be two or more components, with a focus fluid (such as water or oil) entrapped or sandwiched between the boundary element and a deformable focus membrane, in which configuration the focus fluid and the focus membrane would together comprise the focus element. When a membrane is used, suitable materials would include polydimethylsiloxane, or PDMS, such as Sylgard® 184 silicone elastomer, available as a kit from Dow Corning Corporation, Midland, Mich., USA. The membrane thickness may be selected based on factors such as the size of the focus module in question and may be, for example, from about 0.1 to about 1 mm, for example, 0.2, 0.3, or 0.4 mm.

When a focus fluid is used, its properties should be selected for compatibility with the other materials, stability under use, tolerance for the anticipated temperatures at which it will be used, and similar factors. Optical fluids and optical grade oils, such as optical grade mineral oils, may be used. One suitable optical fluid is Type A immersion oil, available from Cargille-Sacher Laboratories Inc., Cedar Grove, N.J., USA. Another suitable fluid is the Santovac® polyphenyl ether-based optical fluid SL-5267, available from Arch Technology Holding LLC., St. Charles, Mo., USA. Water may also be used, such as de-ionized water.

As previously noted, the boundary element and focus element must be optically clear, at least in that portion thereof used to transmit image information. Thus, while the entirety of each such element would normally be optically clear in order to simplify manufacture and assembly, it is also possible for at least a part of an outer ring portion of either or both of the boundary element and focus element to be translucent or opaque, surrounding an inner portion that is optically clear.

When it is desired to minimize loss of light transmitted through the focus module due to reflection loss, the materials selected for the boundary element and focus element should have similar indices of refraction. For example, where the focus module includes a glass boundary element, a focus fluid, and a focus membrane, one should consider the difference in indices of refraction both of the focus fluid compared to the boundary element, and of the focus fluid compared to the focus membrane. The greater the difference in indices, the more light will be loss to reflection as it attempts to pass from one material (such as glass) to the next (such as an immersion oil). Conversely, the closer the indices, the less light will be lost to reflection. In this context the indices will ideally identical, and preferably will be within about +/−0.001 to 0.01, such as about 0.002. However, there may be situations where differences in the indices of refraction may be advantageous, such as to reduce certain types of aberrations.

It is also possible to vary the thickness of the focus membrane over the deformation area, which would result in a structure having aspheric attributes while retaining the variability otherwise enabled by the present invention.

Choosing a focus fluid with a relatively high index of refraction will reduce the amount of deformation needed to obtain a given change in focal distance. For example, a suitable index of refraction would be in the range of from about 1.3 or about 1.5 to about 1.6 or about 1.7, such as an index of about 1.5 or about 1.6.

The pressure element may similarly be any of a variety of materials, including metal, plastic, and ceramic. The choice of material will depend on compatibility with other materials and on the desired response to force exerted by the deforming element. If it is desired that the pressure element not itself deform, it should be an inelastic material such as metal, ceramic, or plastic. If, however, it is desired or necessary that the pressure element change its shape or configuration in response to the deforming element, it should be composed of a deformable material such as an elastomer.

Figures 12A, 12B, 12C, 12D:
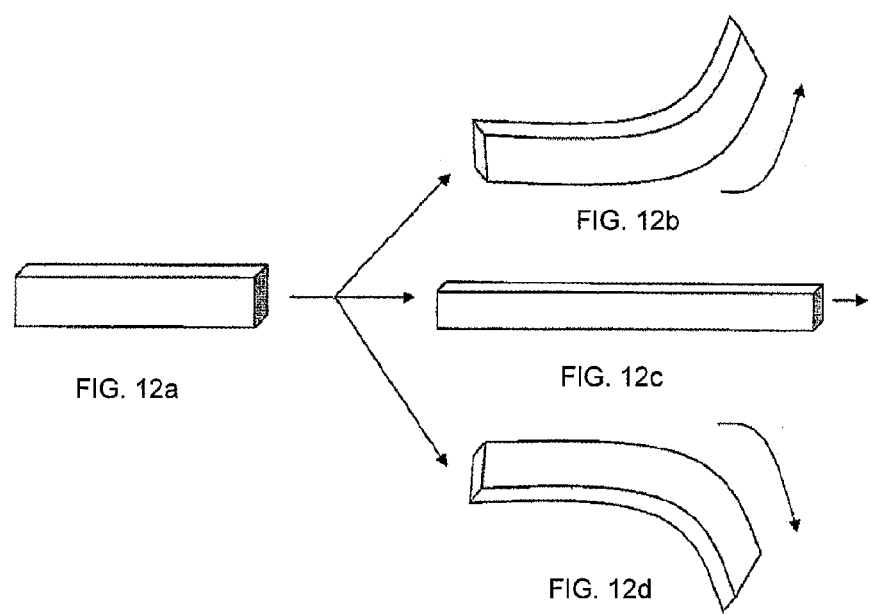
FIGS. 12a-12d show various ranges or directions of motion for the deforming element.

The deforming element is the component that responds to a control signal by varying the force applied to the focus element, either indirectly (such as through the pressure element) or directly. Particularly suitable for use as the deforming element are electroactive or electroconducting polymer actuators. One example is Electroactive Polymer Artificial Muscle and/or the Universal Muscle Actuator™ platform, available through Artificial Muscle, Inc., of Menlo Park, Calif., USA. Another example is conducting polymer actuator available from EAMEX Corporation of Osaka, Japan.

Where the deforming element is an artificial muscle or electro-actuated polymer, it may be possible to provide the deforming element as two or more layers, analogous to layers of muscle fiber. Moreover, where each layer deforms in a particular direction in response to electrical stimuli, this effect may be used to select a given direction of motion for the overall layered assembly. In this way, and taking for example a deforming element in which layers of artificial muscle of polymer have been assembled into the shape of a rectangular solid as shown in FIG. 12a, the rectangular solid may then curl up as shown in FIG. 12b, extend laterally as shown in FIG. 12c, or curl down as shown in Fig. d, or even twist, in response to electrical stimuli, though use of a non-elastic structure to constrain one or more directions of motion, or to force the motion in a particular manner, may be required. FIGS. 12b and 12d depict non-uniform curvature of the rectangular solid, which could be accomplished by constraining a portion of the rectangular solid such as by a frame or other external structure (not shown), by anchoring or fixing a portion of the solid to an inelastic element, or by appropriate construction or selection of the layers which comprise the solid. Alternatively, the rectangular solid may exhibit a constant radius of curvature along its length, for example, the curve formed by a longer side may represent an arc along the circumference of a circle. Where multiple electrical circuits are present in the deforming element, the electrical stimuli may include applying voltage to less than all of the circuits, and/or applying voltage of opposite polarities to those circuits.

Figure 2:
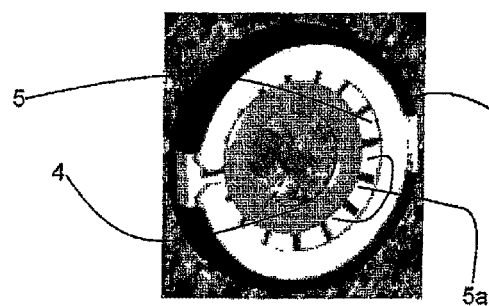
FIG. 2 is the focus module of FIG. 1 as viewed from the right side.

These changes in shape may further be accomplished by layering as described, with each layer, or combinations of layers, having its or their own electrical control circuit; or, the deforming element may be constrained by a frame or other structure that limits its motion in one or more direction, thereby forcing movement in the desired direction. Similar effects may be accomplished by making the layers of unequal dimension; for example, in a two-layer structure, if one layer is longer than the other in a particular dimension, then actuation of the layers will generally produce curling in the direction of the shorter layer. This mode of action may be better understood by reference to deforming element 5 as shown in FIGS. 1, 2, and 6; in FIG. 6, for example, the finger or tab-like elements 5a may function by containing two or more layers of polymer, with the layers closer to the focus membrane being shorter than those closer to the boundary element. When deforming element 5 is activated, this difference in the size or dimensions of the layers will cause each finger element 5a to curl or flex towards the pressure element, forcing it in the direction of the focus membrane, and this motion will in turn deform the focus membrane into the shape of a convex lens. Alternatively, a non-deforming layer may be included in the structure, in which case the deforming layer or layers will generally curl or move towards or in the direction of the non-deforming layer.

Figures 13A, 13B:
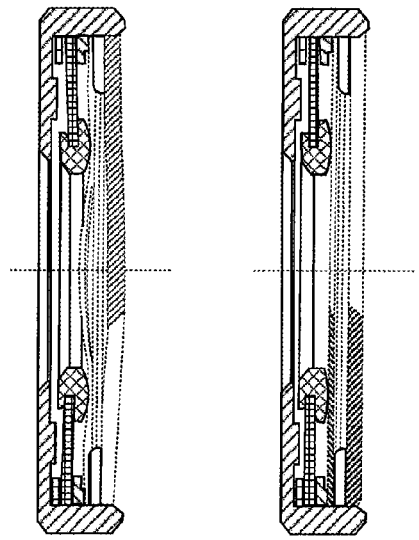
FIGS. 13a and 13b show a bi-convex electro-actuated polymer membrane lens.

FIGS. 13a and 13b demonstrate a bi-convex electro-actuated polymer membrane lens. In this embodiment, when both surfaces are deformable membranes, it is possible to construct a bi-convex lens. Moreover, the two surfaces of the membranes may have different surface curvatures due to different membrane diameters. Differences in the material, and thickness, of the membrane can also be used to create different surface shapes.

FIG. 14 shows a multiple deformable membrane lens assembly, and it should be noted that a zoom lens can be achieved using two (or more) lenses actuated by electro-actuated polymer and other fixed elements.

FIGS. 15a and 15b show that by placing a conventional lens in an electro-actuated polymer mechanism, a variable location lens element can be made for compact auto-focus or zoom applications, with additional fixed elements.

As noted, the deforming element may act directly on the focus element, as by being in direct contact with it. Alternatively, force generated by activation of the deforming element may be transmitted to the focus element through one or more intermediary devices or elements. As an example, a pressure element may be adjacent to and in contact with the focus element, and the deforming element may press on the pressure element, which transmits that force through to the focus element. In one embodiment the pressure element may be in the shape of an annulus, or doughnut, and may be in direct or indirect contact with an outer ring portion of the focus element.

The conductor element communicates the control signal to the deforming element. Where the deforming element responds to electric signals, as in the case of electro-actuated polymers, it generally serves as a conductor for conducting electrical motive power from the power source to the deforming element. It should therefore be conductive, preferably highly conductive, at least in relevant portions, and may comprise a conductive material, including a conductive metal such as copper; a conductive plastic; or an elastomer that has been treated or doped, such as with carbon, to render it conductive. Specific examples include use of flexible printed circuits (FPC) and sputtering or evaporating a conductive metal onto the surface of the deforming element.

As depicted in FIG. 1, the conductor element comprises two components, one on either side of the deforming element, with each component having an electrical contact access 6c for connection to a power source. In this embodiment the deforming element will be uniformly activated or deactivated in response to the presence or absence of an electrical signal, and the convex meniscus formed by the focus element will be symmetrical.

However, it is also contemplated that the conductor element may include a plurality of circuits enabling selective actuation of one or more portions of the deforming element, thereby allowing tunable steering of the focus element by enabling the convex meniscus to be selectively asymmetric. For example, and with reference to FIG. 6, the deforming element is shown as a single conductive element. Alternatively, the deforming element could be constructed, such as by the use of insulating materials between flex circuits, such that each finger (also shown as elements 5a in FIG. 2), or combinations thereof, provide separate and independently energizable circuits.

By choosing which circuits to energize, and how much control signal to apply, the system could control not only the formation and magnitude of the meniscus, but also its tilt. In this context, tilt refers to the possible combinations of pitch and yaw that may be used to configure the meniscus to have shapes other than symmetric to an axis normal to the boundary element and centered in the fluid chamber. A simple example is shown in FIG. 7, in which focus fluid 3b has been further represented as having meniscus element 3c, shown as having a non-symmetric shape in response to selective application of control signals to a multi-circuit conductor element (not shown).

The conductor element is connected to a power source selected to deliver the range and polarity of voltage necessary to drive the deforming element through its full intended range of motion.

The figures may be referenced to provide further context for the above discussion, it being understood that they merely present one specific construct of the focus module as a convenience for purposes of the this discussion.

In particular, FIG. 1 provides an exploded view of one embodiment of the focus module. In this embodiment, spacer element 2 creates a spaced-apart relationship between boundary element 1 and focus element 3. Pressure element 4 rests against focus element 3, and is acted on by deforming element 5, which is itself acted on by conductor element 6. In the embodiment shown, conductor element 6 comprises two sub-elements 6a and 6b, which are conductive elements used to transmit electrical control signals to deforming element 5. Element 6c is an electric contact access for conductor element 6. A complementary electric contact access is present on element 6a, but is not visible in FIG. 1. Element 7 is a housing element, and serves to provide a physical environment for the focus module.

Figure 3:
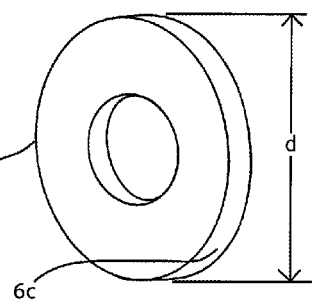
FIG. 3 is the focus module of FIG. 1 as viewed from the left side.

FIGS. 2 and 3 show the focus module embodiment of FIG. 1 in assembled form, in which housing element 7, electrical contact element 6c, deforming element 5, and pressure element 4 are most visible. In the perspective of FIG. 2 the assembled focus module is viewed from the right side of FIG. 1, with the boundary element closest to the viewer, and in FIG. 3 the assembled focus module is viewed from the left side of FIG. 1.

The overall size of the assembled focus module is not critical and may be varied depending on the size of the available components, the device into which it will be placed or assembled, and the needs of the user. In general, the focus module, which is generally cylindrical as shown in FIGS. 2 and 3, will have a diameter d of from about 5, 7, or 9 mm to as large as about 11, 13, 15, or 20 mm. The size may be selected in order to maximize or achieve drop-in compatibility with existing devices; for example, in camera-enabled cellular telephones, a diameter of about 9, 9.5, or 10 mm may be preferred.

For purposes of example, FIGS. 4a and 5a each depict an assembly including a boundary element 1, focus fluid 3b, focus membrane 3a, and deforming element 5. In FIGS. 4a and 5a, minimal pressure is being applied to focus fluid 3b, and focus membrane 3a is correspondingly planar. In FIGS. 4b and 5b, pressure is being applied by deforming element 5 to focus fluid 3b, and as a result focus membrane is forming a convex lens or meniscus. In FIG. 4a the pressure applied by deforming element 5 is exerted in a direction substantially normal to the plane represented by focus membrane 3a and in the direction of boundary element 1, reducing the height of the chamber containing the focus fluid around its circumference and thereby forcing fluid from the periphery of the fluid chamber into the middle; this effect produces the convex meniscus visible in FIG. 4b.

As previously noted, the deforming element may act on the focus element directly or indirectly. Also as previously indicated, direct action may involve placing the deforming element directly adjacent the focus element, for example, directly contacting the focus membrane when the focus element is comprised of a focus membrane and a focus fluid entrapped between the focus membrane and the boundary element, with a spacer element defining the wall of a chamber holding the focus fluid. In an alternative embodiment, the deforming element may itself comprise the wall separating the boundary element and the focus membrane. This embodiment is shown in FIG. 5a, where deforming element 5 is also serving as the wall of the cylindrical chamber containing the focus fluid 3b, that chamber having a 'top' wall formed by the focus membrane 3a and a 'bottom' wall formed by the boundary element 1.

In this embodiment the pressure exerted by deforming/spacer element 5 is exerted in a direction substantially parallel to the plane represented by focus membrane 3a and in the direction of the middle of the fluid chamber. Depending on the characteristics of the material used for the deforming element, this pressure may not be accompanied by any change in height of the fluid chamber, and the deforming element may simply increase its thickness radially. Alternatively, the extension of the deforming element radially inward may be accompanied by a decrease in height or thickness of the deforming element inward as shown in FIG. 5b, effectively drawing focus membrane 3a and boundary element 1 towards each other and contributing to the formation of the convex meniscus; not only is the inward radial movement of the deforming element forcing the focus fluid to occupy a smaller-diameter cylinder, but the drawing-together of the focus membrane and boundary element are also reducing the height of that cylinder.

More generally, and with reference to FIG. 8, the focus module may include a cylinder 100 having at least a top surface 101, a bottom surface 102, an outer wall 103, a fluid interior volume 104, the cylinder having diameter d and height h. When the actuator element is external to this structure it will exert pressure on at least one of the top surface, bottom surface, or outer wall in order to reduce one or both of height h and diameter d. Because the contents of the fluid interior volume are incompressible, this reduction in height and/or diameter must be offset by a corresponding expansion of the volume in some direction which, in the case of the focus module, will involve deformation of one or both of top surface 101 and bottom surface 102. FIGS. 9 and 10 provide a simplified, straight side-on view of this effect. In particular FIG. 9 provides an illustration of deformation caused by a reduction in height, with the cylinder now having the same diameter d but height h'<h, and FIG. 10 provides an illustration of a deformation caused by a reduction in diameter, with the cylinder having the same height h but diameter d'<d; neither illustration is necessarily to scale. In both of these illustrations the deformation and corresponding change in one dimension if offset by a convex distortion of the top surface 101. In these embodiments the deforming or actuator element may be exerting pressure on the fluid interior as shown in FIGS. 1-5. Of course, both the diameter and the height may be changed at the same time, and this could be used to produce a relatively larger meniscus, and/or to decrease the time required to form the meniscus.

Alternatively, the deforming or actuator element may comprise part or all of outer wall 103, as show in FIGS. 11a and 11b. Here the cylinder is shown in cross-section to illustrate the annular nature of deforming element 5. In FIG. 11a the upper deformable surface (not shown) will be planar, while in FIG. 11b the deforming element has responded to actuation by contracting in the vertical or "h" dimension and extending or elongating in the horizontal or "d" dimension. In FIG. 11b the effect is shown with the deforming element drawing the upper and lower surfaces together uniformly over their entire surface area, which requires that the exterior circumference of one or both be vertically moveable or slideable rather than fixed or anchored. (In this discussion, directional references such as "horizontal", "vertical", and the like are generally used in the relative rather than absolute sense, with, for example, vertical referring to the direction defined by a line normal to the top and bottom surfaces when both are planar, and horizontal referring to the direction defined by a line parallel to those surfaces when both are planar.) However, it is also contemplated that at least one surface or surface edge will be anchored or fixed, which will result in a different effect when the deforming element changes its dimensions. For example, and with reference to FIG. 11b, if the top surface is deformable while the bottom surface is rigid, and the outer circumference of the cylinder is constrained such as by being contained within a ring of metal, ceramic, or other rigid material, movement of the deforming material to contract or compress in the vertical dimension and to extend or elongate in the horizontal dimension will not be uniform and symmetrical, but may, for example, result in a funnel-like shape as shown in FIG. 11c.

It should be noted that it is equally possible to construct the focus module to produce a concave lens. For example, the pressure ring and deforming element could be positioned under the focus membrane, between that membrane and the spacer element, and activation of the deforming element could increase, rather than decrease, the height of the fluid chamber around its circumference or periphery. The same effect would be achieved if the deforming element also served as the spacer element, as discussed elsewhere herein, with the pressure element positioned between the deforming element and the focus membrane. The pressure element need not be present, in which case the deforming element would act directly on the focus membrane.

Another concave lens embodiment may be considered in reference to a particular method of preparing and filling the fluid chamber. First, one or more boundary elements, such as glass plates, are placed in recesses provided in a support structure such as a metal plate. Spacer elements, such as double-sided tape, are then placed on each glass plate. Next, a sheet or layer of PDMS is placed over the glass plate-spacer element assemblies; this sheet may, for example, be prepared by spin-coating the PDMS to a desired thickness using known techniques. The resulting assemblies of glass plate boundary element, spacer element, and PDMS membrane element are then placed under vacuum, focus fluid is added, and the vacuum is released to draw the focus fluid into the fluid chambers. If this filling process is stopped before the fluid chambers are completely filled, the initial shape of the focus membrane will be concave. Depending on the degree of concavity selected, and the parameters chosen for the rest of the focus module, the resulting module may function only by varying the degree of concavity of the focus element, or may be capable of deforming the membrane from a concave state to a flat state, and even of deforming it beyond a flat state to a convex state.

The deforming element has an active and passive state, depending on whether or not a control signal is being applied, and has a continuous transition between the two states, preferably in linear response to the strength of the control signal. Using "deactivated" to describe the state of the deforming element when the control signal is at zero or minimal input, and "activated" to describe the state of the deforming element when the control signal is applied, the system may be configured either such that the deactivated state is when maximum force is being applied to the focus element, or when minimal force is being applied.

Therefore, FIGS. 4a and 5a may be characterized as representing deactivated states, the system being configured such that the deforming element is communicating minimum force to the focus fluid when no control signal is being applied, and FIGS. 4b and 5b may represent activated states, in which a control signal is being applied to energize the deforming element. However, it is possible also configure the system in the opposite sense, so that FIGS. 4a and 5a represent that state of the system when the control signal is being applied, and FIGS. 4b and 5b represent its state when the control signal is at zero or minimal strength. In more common terms, the deforming element may either be relaxed (as in FIGS. 4a and 5a) when the power is off and stretched or expanded (as in FIGS. 4b and 5b) when power is on, or vice versa. This generally translates into what the desired 'resting' state of the focus module should be. When the focus membrane is planar the focus is set to infinity, and when it is convex the focus is at a finite distance, such as from about 5 mm to about 500 mm, including all points there between, such as about 50, 100, 150, or 200 mm. Configuring this aspect of the system may therefore depend on whether the user wishes the 'normal' or 'resting' state to be focused on infinity, or closer in.

While the foregoing discussion has been presented in the context of a focus element comprised of a focus fluid and focus membrane, it is also applicable to the alternative embodiment where the focus element is unitary, as in the case of a fluid-filled/oil-filled elastomer. In this embodiment, the outer surface of the focus elastomer provides the function of the focus membrane, and the interior of the focus elastomer provides the function of the focus fluid.

The deforming element and related assembly of the present invention may also be used to control motion of a conventional, rather than fluid, lens. It is further possible to combine the focus module of the present invention with one or more conventional or fluid/adaptive lenses, and/or with one or more other focus modules. In this way further functionalities such as zoom or autozoom may be realized. These and related concepts are further described in the Appendix being filed contemporaneously with this disclosure.

The focus module may be used in a wide variety of devices having or using imaging capabilities, including data collection devices such as bar code scanners, portable data terminals (PDTs), portable data assistants (PDAs), camera-enabled cellular telephones, still picture cameras, moving picture cameras, and the like, further including both fixed-mount and portable devices. The focus module may be used in any size and type of such device, but due to its small size and minimal use of moving parts, it is especially well-suited for devices where minimal use of space is particularly desirable, and/or where ruggedization is desired against shock, vibration, and other environmental influences that could affect the operability and/or effective lifespan of components having more and/or more delicate moving parts.

As one particular but non-limiting example, the present invention may be applied to apparatus and methods useful for imaging, capturing, decoding and utilizing information represented by encoded indicia such as bar codes (for example, 1D bar codes, 2D bar codes, and stacked bar codes), optically recognizable characters (for example printed, typed, or handwritten alphanumeric symbols, punctuation, and other OCR symbols having a predefined meaning), as well as selected graphical images such as icons, logos, and pictographs. The apparatus and methods involve the use of one or more focus modules with data readers such as hand held bar code readers to accomplish such tasks as imaging barcodes and other optically readable information, including focusing on images of interest, and improving image quality by removing artifacts such as jitter introduced by a user who is manually operating a reader of the invention.

The device which has been described and which has been termed a liquid lens of variable focal length has many other applications. It may be employed, for example, as an electrostatic voltmeter, as the alteration in the divergence or convergence of a translated beam is a function of the intensity of the impressed field. The device may be employed in connection with suitable apparatus for the transmission of audible or other signals over a beam of light. When the device is employed in connection with transmission of audible signs it may be said to modulate the beam of light at audible frequencies, and where such an expression is used in the claims it should be so interpreted. It is also suited for use in sound-recording on motion picture film.

Although the focus module of the present invention is generally driven by what may be characterized as an electric potential, the electrical signals or stimuli used to control the focus module may be characterized in terms of voltages (electric potentials, or electric potential differences), as well as other electrical parameters, such as electric current or electric charge (the time integral of electric current). For the purposes of the present disclosure, the focus module, and in particular the deforming element (as acted upon through the conductor element), may be controlled by an applied electrical signal for driving any type of fluid (or reconfigurable) lens that responds to the applied signal by exhibiting adjustable behavior based on the interaction of light with two or more fluids (or a fluid and vacuum) having differing optical indices.

We now describe apparatus and methods of operation that embody various features and aspects of the invention, in the form of readers having the capability to obtain images, and to detect, analyze, and decode such images. In particular, the readers of the invention can in some embodiments be hand held, portable apparatus that can image encoded indicia, such as bar codes of a variety of types (1D, 2D, stacked 1D, and other bar codes), and symbols such as handwritten, printed, and typed characters (for example using optical character recognition methods), as well as imaging surfaces or objects that are amenable to being identified using optical illumination.

Figure 16A:
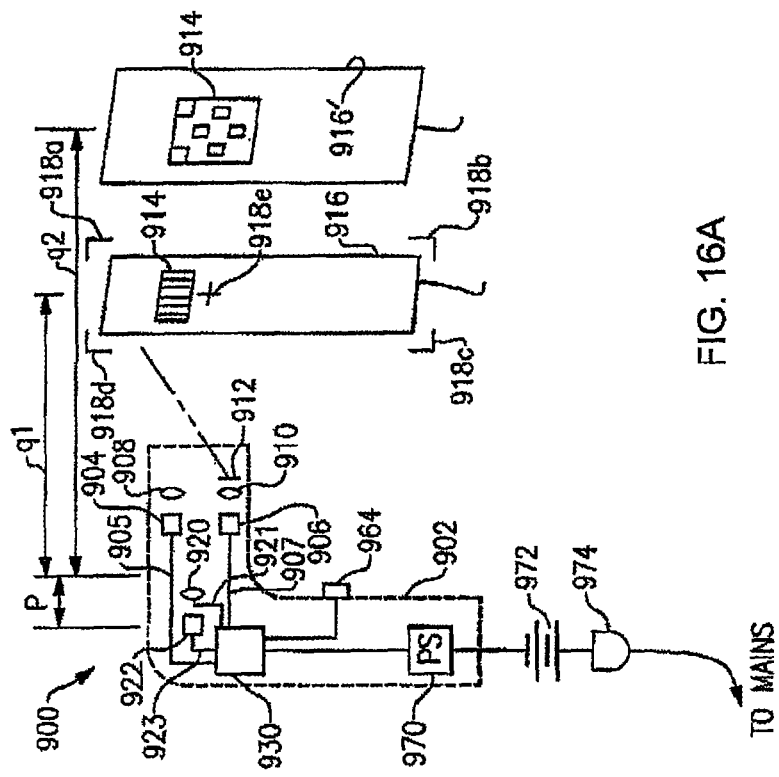
FIG. 16A is a diagram showing a reader.
Figure 16B:
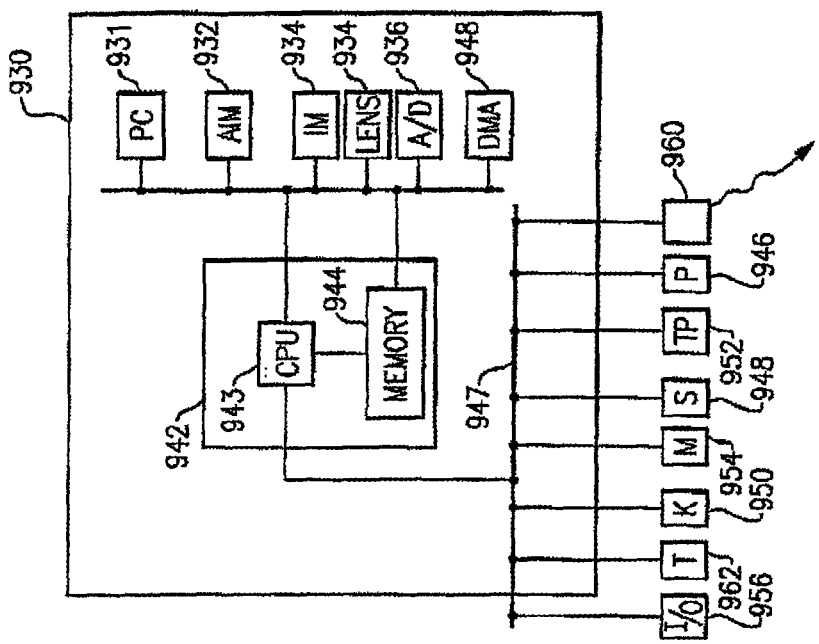
FIG. 16B is a diagram showing the control circuitry of the reader of FIG. 16A in greater detail.

FIG. 16A is a diagram showing a reader 900, such as a bar code scanner, embodying features of the invention. The reader 900 comprises various optical components and components of hardware and software for controlling the operation of the reader 900 and for analyzing an image acquired by the reader 900. FIG. 16B is a diagram showing the control circuitry of the reader of FIG. 16A in greater detail. In FIG. 16A, a case 902 is shown in dotted schematic outline. The case 902 can in principle be any convenient enclosure or frame for supporting the various components in suitable mutual orientation, and in some embodiments is a case adapted to be held in a hand of a user, as described in greater detail herein below in conjunction with FIGS. 15a and 15b. The reader 900 comprises sources of illumination 904, 906 that can be operated in various circumstances to illuminate a target and to provide an aiming signal. The illumination source 904 is in general a source comprising one or more light sources such as lamps or LEDs that provide illumination at a convenient wavelength, such as red or green illumination, for illuminating a target whose image is to be acquired. The aimer source 906 in some embodiments is a second LED that is used to back illuminate a slit that creates an aiming signal. This slit is then imaged onto the target 914 with an appropriate imaging optics. Alternately the aimer source (LED) 906 operates at a different wavelength from the illumination source 904 (for example, the illumination source may be red for illumination and the aiming source may be green for the aiming signal) so that it is easily distinguished there from. The aimer source 906 is used by an operator of the reader 900 to ascertain what the reader is aimed at. Optics 908 are provided for distributing the illumination from illumination source 904 in a pattern calculated to illuminate a target 914. In a preferred embodiment the target is illuminated optimally. In one embodiment a collimation lens 910 and a diffractive element 912 are optionally provided to collimate the light from a laser aimer source 906, and to spread or diffract the light from the aimer source 906 in a predefined pattern, respectively. As can be seen in FIG. 16A, an object 914 to be imaged is situated on an object plane 916 located at a distance q1 from the reader 900. The object 914 is for example a bar code affixed to a surface, namely the object plane 916. For purposes of discussion, there is also shown in FIG. 16A a second object plane 916' located at a greater distance q2 from the reader 900, and having thereon an object 914' (which can also be a bar code). The surface 916, 916' is preferably illuminated, either by light from the illumination source 904, or by ambient light, or a combination thereof. As can be seen in FIG. 16A, the aimer 906, the collimation lens 910 and the diffractive element 912 in combination provide a locator pattern 918, comprising 5 elements 918a-918e in FIG. 16A, that identify for a user where the reader 900 is aimed, so that a desired target can be made to fall within the aiming area of the reader 900. Light reflected from the target (or alternatively, light generated at the target) is captured by the reader using a lens 920, which in some embodiments comprises a fluid lens and possibly one or more fixed lenses, and is conveyed via the fluid lens to an imager 922. The imager 922 in various embodiments is a 1D or 2D semiconductor array sensor, constructed using any convenient processing technology, such as a CMOS sensor, a CCD sensor, or the like. The imager 922 converts the optical signals that it receives into electrical signals that represent individual pixels of the total image, or frame, or a portion thereof. In various embodiments, the imager can be any of a color CCD imager, and a color CMOS imager.

The reader 900 also includes various hardware components, shown in a single control element 930 for controlling and for acquiring signals from the reader 900 in FIG. 16A. The details of control element 930 are shown in FIG. 16B. An illumination control 931 is provided to control the intensity and timing of illumination provided by the illumination source 904. The illumination control 931 is in electrical communication with illumination source 904 by way of a cable 905 comprising conductors. An aimer control 932 is provided to control the intensity, color and timing of illumination provided by the aimer source 906. The aimer control 932 is in electrical communication with aimer source 906 by way of a cable 907 comprising conductors. An imager control 934 is provided to control the timing and operation of the imager 922, for example by providing clocking signals to operate the image, reset signals, start and stop signals for capturing illumination, and synchronization signals for providing electrical output as data indicative of the intensity of illumination received at any pixel of the imager array 922, which data may be provided as analog or as digital data. The imager control 934 is in electrical communication with imager 922 by way of a cable 923 comprising conductors. A lens controller 938 is provided to control the behavior of the fluid lens 920. The lens controller 938 and the fluid lens 920 are in electrical communication by way of a cable 921 comprising conductors.

An analog-to-digital converter 936 is provided for converting analog signals output by the imager 922 to digital signals. In some embodiments, a DMA controller 948 is provided to allow direct transfer of digital data to a memory for storage. In general, any and all of illumination control 931, aimer control 932, imager control 934, A/D 936 and DMA 948 are connected to a general purpose programmable computer 942 by way of one or more buses 945, which buses 945 may be serial buses or parallel buses as is considered most convenient and advantageous. The general purpose programmable computer 942 comprises the usual components, including a CPU 943 which can in some embodiments be a microprocessor, and memory 944 (for example semiconductor memory such as RAM, ROM, magnetic memory such as disks, or optical memory such as CD-ROM). The general purpose computer can also communicate via one or more buses 947 with a wide variety of input and output devices. For example, there can be provided any or all of an output device 946 such as a display, a speaker 948 or other enunciator, devices for inputting commands or data to the computer such as a keyboard 950, a touchpad 952, a microphone 954, and bidirectional devices such as one or more I/O ports 956 which can be hardwired (i.e., serial, parallel, USB, firewire and the like) or can be wireless (i.e., radio, WiFi, infra-red, and the like). The general purpose programmable computer 942 can also comprise, or can control, indicators 960 such as LEDs for indicating status or other information to a user.

As shown in FIG. 16A, the reader 900 and/or the general purpose computer 942 (as shown in FIG. 16B) can comprise one or more trigger switches 964 that allow a user to indicate a command or a status to the reader 900. In addition, the entire system is provided with electrical power by the use of one or more of a power supply 970, batteries 972 and a charger 974. Any convenient source of electrical power that can be used to operate the reader 900 and its associated general purpose programmable computer 942 (as shown in FIG. 16B) is contemplated, including the conventional electrical grid (which can be accessed by connection to a conventional wall plug), and alternative power sources such as emergency generators, solar cells, wind turbines, hydroelectric power, and the like.

A laser bar code scanner can be implemented with a steering lens configuration. See FIGS. 38A-38C herein below. Rather than using a scanning mirror or motor as presently used in bar code scanners, the scanning motion can be achieved with a steerable fluid lens. At the same time the laser spot location of narrowest beam width can also be effected with the same or a different fluid lens. Such a scanning system can also be coaxial in nature, where the receive and transmit light beams both focus at the same section of the bar code pattern being scanned. This receive optical system is not shown, but these are well known to those in the art. A cylindrical or spherical scanning fluid lens may be used depending upon if the designer wishes to develop a single scan line or a raster scan line. It is also envisioned that it may be possible to develop a fluid element that scans only, without having optical power. Such systems are also contemplated.

As may be seen from FIG. 16A, the distance at which the reader of the invention can operate, or equivalently, a focal length of the optical system of the reader, can vary as the distance q from the lens to the object to be imaged varies. The focal length for a specific geometrical situation can be determined from the formula $$1/f = 1/p + 1/q$$

in which f is the focal length of a lens, p is the distance from the lens to a surface at which a desired image is observed (such as an imaging sensor or a photographic film), and q is a distance between the lens and the object being observed.

Consider the two objects situated at a nearer distance q1 and a farther distance q2 from the reader lens (e.g., q2>q1). In a system that is less expensive and more convenient to construct, the distance p (from the lens 920 to the imaging sensor 922) is fixed. One can image objects lying at the distance q1 from the lens with a focal length given by 1/f1=1/p+1/q1, and one can image objects lying at the distance q2 from the lens with a focal length given by 1/f2=1/p+1/q2. Since q2>q1, and p is constant, we have f1<f2. In particular, for a reader comprising a fluid lens that can provide a minimum focal length of f1 and a maximum focal length of f2, for a fixed value of p, one would have the ability to observe in proper focus objects at distances ranging at least from q1 to q2, without consideration for issues such as depth of field at a particular focal length setting of the lens. By way of example, q1 might be a short distance such as 4 inches (approximately 10 cm) so that one can image a target object having much detail (such as a high density bar code) with recovery or decoding of all of the detail present in the object. On the other hand, q2 might be a longer distance, such as 12 inches (approximately 30 cm) or more, whereby a reader can image an object at longer distance with lesser density (e.g., fewer pixels of resolution per unit of length or area observed at the target object). Accordingly, a reader of the invention comprising a particular imaging sensor can be configured to perform at either extreme of high density/short distance or of low density/long distance (or any variant intermediate to the two limits) by the simple expedient of controlling the focal length of the fluid lens such that an object at the intended distance d in the range q2≥d≥q1 will be imaged correctly.

The lens can be caused to either manually or automatically change its focal length until the best focus is achieved for an object at a given distance away. One way to do this is to minimize the so-called blur circle made by a point or object within the field of view. This can be done automatically by a microprocessor that varies the focal length of the lens and measures the size of the blur circle on a CCD or CMOS imager; i.e. the number of pixels the blur circle fills. The focal length at which the blur circle is smallest is the best focus and the lens is held at that position. If something in the field of view changes, e.g. the object gets farther away from the lens, then the microprocessor would detect the change and size of the blur circle and reinitiate the automatic focusing procedure.

The object used to measure the blur circle could be a detail inherently in the field of view, or it could be a superimposed object in the field of view. As an example, one could project an IR laser spot into the field (the wavelength of the IR is beyond the sensitivity of the human eye, but not of the CCD or CMOS image sensor). Another means of achieving best focus includes transforming the image into the frequency domain, for example with a Fourier transform, and then adjusting the focal length of the fluid lens to maximize the resulting high frequency components of that transformed image. Wavelet transforms of the image can be used in a similar fashion. Both the frequency domain and wavelet techniques are simply techniques for achieving best focus via maximization of contrast among the pixels of the CCD or CMOS image sensor. These and similar procedures, such as maximizing the intensity difference between adjacent pixels, are known in the art and are commonly used for passive focusing of digital cameras.

Figure 17:
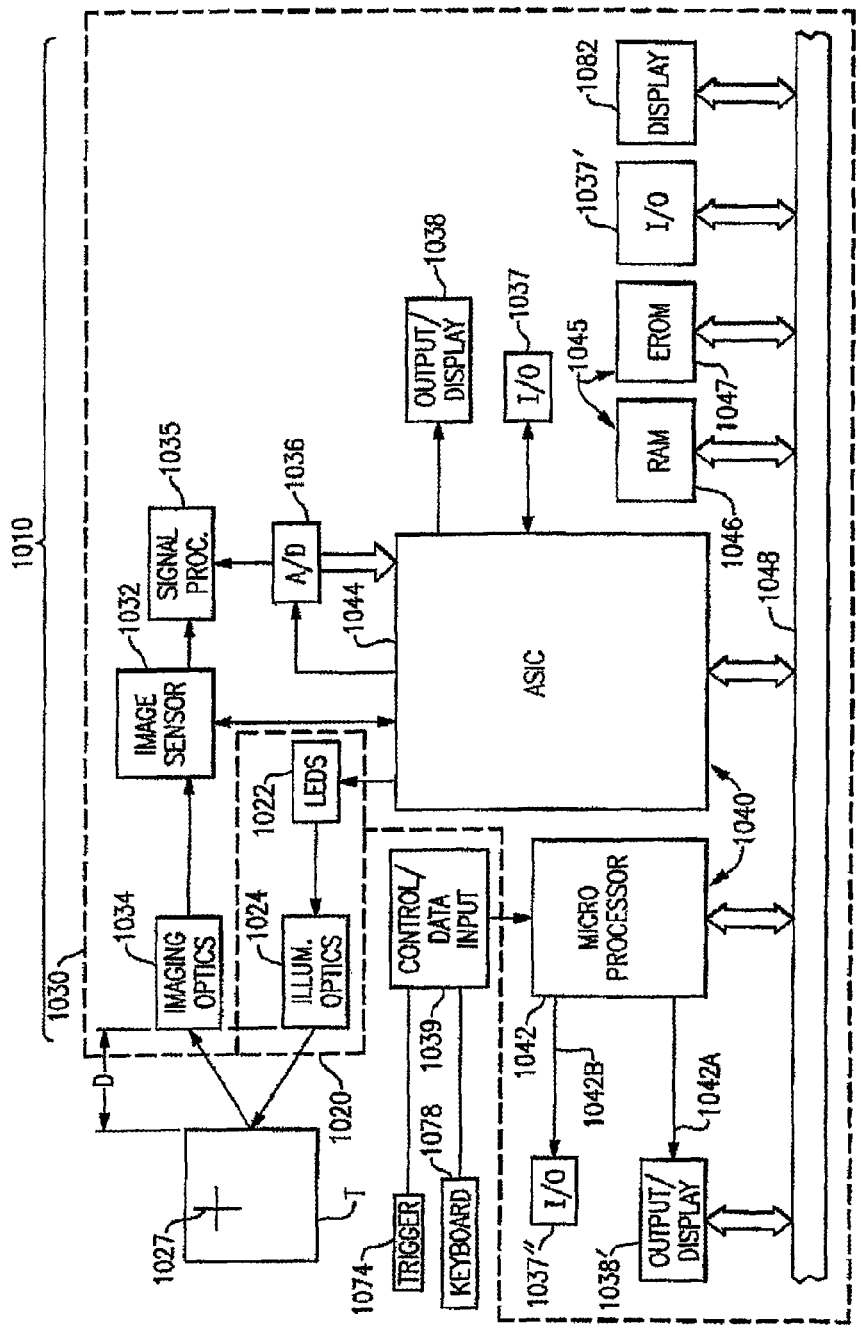
FIG. 17 is a block diagram of an optical reader showing a general purpose microprocessor system that is useful with various embodiments of the invention.

FIG. 17 is a block diagram of an optical reader showing a general purpose microprocessor system that is useful with various embodiments of the invention. Optical reader 1010 includes an illumination assembly 1020 for illuminating a target object T, such as a 1D or 2D bar code symbol, and an imaging assembly 1030 for receiving an image of object T and generating an electrical output signal indicative of the data optically encoded therein. Illumination assembly 1020 may, for example, include an illumination source assembly 1022, together with an illuminating optics assembly 1024, such as one or more lenses, diffusers, wedges, reflectors or a combination of such elements, for directing light from light source 1022 in the direction of a target object T. Illumination assembly 1020 may comprise, for example, laser or light emitting diodes (LEDs) such as white LEDs or red LEDs. Illumination assembly 1020 may include target illumination and optics for projecting an aiming pattern 1027 on target T. Illumination assembly 1020 may be eliminated if ambient light levels are certain to be high enough to allow high quality images of object T to be taken. Imaging assembly 1030 may include an image sensor 1032, such as a 1D or 2D CCD, CMOS, NMOS, PMOS, CID OR CMD solid state image sensor, together with an imaging optics assembly 1034 for receiving and focusing an image of object T onto image sensor 1032.

The array-based imaging assembly shown in FIG. 17 may be replaced by a laser array based scanning assembly comprising at least one laser source, a scanning mechanism, emit and receive optics, at least one photodetector and accompanying signal processing circuitry. See FIGS. 38A, 38B, and 38C herein below, and the associated description.

A partial frame clock out mode is readily implemented utilizing an image sensor which can be commanded by a control module to clock out partial frames of image data or which is configured with pixels that can be individually addressed. Using CMOS fabrication techniques, image sensors are readily made so that electrical signals corresponding to certain pixels of a sensor can be selectively clocked out without clocking out electrical signals corresponding to remaining pixels of the sensor, thereby allowing analysis of only a partial frame of data associated with only a portion of the full imager field of view. CMOS image sensors are available from such manufacturers as Symagery, Omni Vision, Sharp, Micron, STMicroelectronics, Kodak, Toshiba, and Mitsubishi. A partial frame clock out mode can also be carried out by selectively activating a frame discharge signal during the course of clocking out a frame of image data from a CCD image sensor. A/D 1036 and signal processor 1035 may individually or both optionally be integrated with the image sensor 1032 onto a single substrate.

Optical reader 1010 of FIG. 17 also includes programmable control circuit (or control module) 1040 which preferably comprises an integrated circuit microprocessor 1042 and an application specific integrated circuit (ASIC 1044). The function of ASIC 1044 could also be provided by a field programmable gate array (FPGA). Processor 1042 and ASIC 1044 are both programmable control devices which are able to receive, to output and to process data in accordance with a stored program stored in memory unit 1045 which may comprise such memory elements as a read/write random access memory or RAM 1046 and an erasable read only memory or EROM 1047. Other memory units that can be used include EPROMs and EEPROMs. RAM 1046 typically includes at least one volatile memory device but may include one or more long term non-volatile memory devices. Processor 1042 and ASIC 1044 are also both connected to a common bus 1048 through which program data and working data, including address data, may be received and transmitted in either direction to any circuitry that is also connected thereto. Processor 1042 and ASIC 1044 differ from one another, however, in how they are made and how they are used. The processing module that is configured to extract information encoded by the encoded indicium employs some or all of the capabilities of processor 1042 and ASIC 1044, and comprises the hardware and as necessary, software and or firmware, required to accomplish the extraction task, including as necessary decoding tasks to convert the raw data of the image to the information encoded in the encoded indicium.

More particularly, processor 1042 is preferably a general purpose, off-the-shelf VLSI integrated circuit microprocessor which has overall control of the circuitry of FIG. 17, but which devotes most of its time to decoding image data stored in RAM 1046 in accordance with program data stored in EROM 1047. ASIC 1044, on the other hand, is preferably a special purpose VLSI integrated circuit, such as a programmable logic array or gate array that is programmed to devote its time to functions other than decoding image data, and thereby relieves processor 1042 from the burden of performing these functions.

The actual division of labor between processors 1042 and 1044 will naturally depend on the type of off-the-shelf microprocessors that are available, the type of image sensor which is used, the rate at which image data is output by imaging assembly 1030, etc. There is nothing in principle, however, that requires that any particular division of labor be made between processors 1042 and 1044, or even that such a division be made at all. This is because special purpose processor 1044 may be eliminated entirely if general purpose processor 1042 is fast enough and powerful enough to perform all of the functions contemplated by the present invention. It will, therefore, be understood that neither the number of processors used, nor the division of labor there between, is of any fundamental significance for purposes of the present invention.

With processor architectures of the type shown in FIG. 17, a typical division of labor between processors 1042 and 1044 will be as follows. Processor 1042 is preferably devoted primarily to such tasks as decoding image data, once such data has been stored in RAM 1046, recognizing characters represented in stored image data according to an optical character recognition (OCR) scheme, handling menuing options and reprogramming functions, processing commands and data received from control/data input unit 1039 which may comprise such elements as a trigger 1074 and a keyboard 1078 and providing overall system level coordination.

Processor 1044 is preferably devoted primarily to controlling the image acquisition process, the A/D conversion process and the storage of image data, including the ability to access memories 1046 and 1047 via a DMA channel. The A/D conversion process can include converting analog signals to digital signals represented as 8-bit (or gray scale) quantities. As A/D converter technology improves, digital signals may be represented using more than 8 bits. Processor 1044 may also perform many timing and communication operations. Processor 1044 may, for example, control the illumination of LEDs 1022, the timing of image sensor 1032 and an analog-to-digital (A/D) converter 1036, the transmission and reception of data to and from a processor external to reader 1010, through an RS-232, a network such as an Ethernet or other packet-based communication technology, a serial bus such as USB, and/or a wireless communication link (or other) compatible I/O interface 1037. Processor 1044 may also control the outputting of user perceptible data via an output device 1038, such as a beeper, a good read LED and/or a display monitor which may be provided by a liquid crystal display such as display 1082. Control of output, display and I/O functions may also be shared between processors 1042 and 1044, as suggested by bus driver I/O and output/display devices 1037' and 1038 or may be duplicated, as suggested by microprocessor serial I/O ports 1042A and 1042B and I/O and display devices 1037" and 1038'. As explained earlier, the specifics of this division of labor is of no significance to the present invention.

Figure 18:
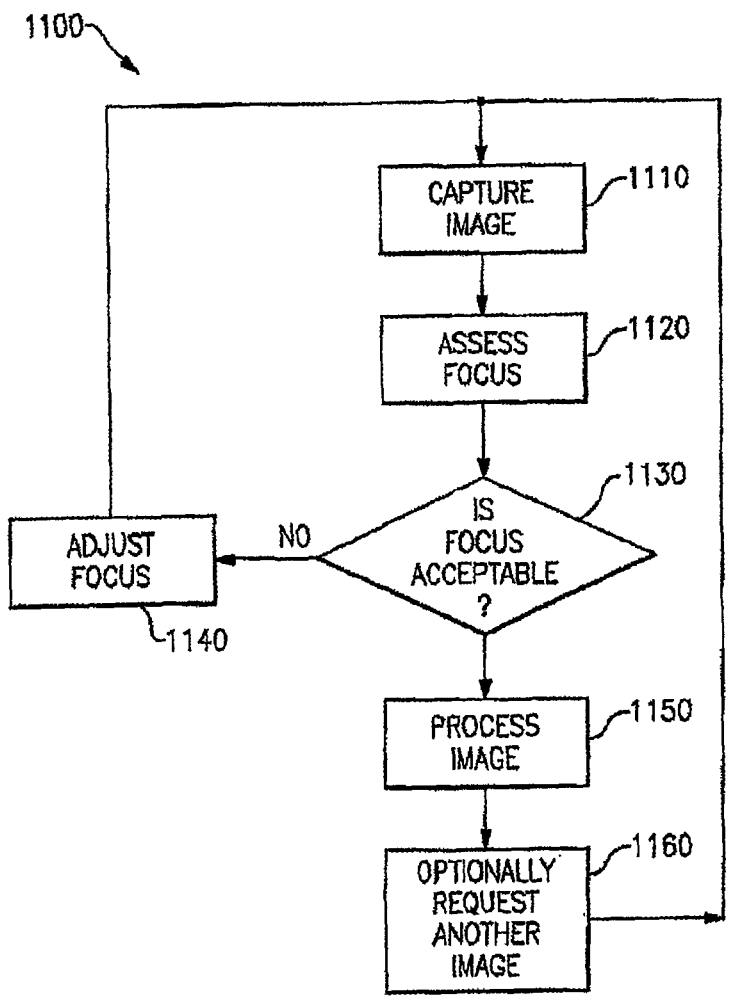
FIG. 18 is a flow chart showing a process for operating a system having an adjustable focus system comprising feedback.

FIG. 18 is a flow chart 1100 showing a process for operating a system having an adjustable focus system comprising feedback, for example a system having components as described in FIG. 16A. The process begins at step 1110, where a command to capture an image is generated, for example by a user depressing a trigger, or by an automated system issuing a capture image command in response to a specified condition, such as an object being sensed as coming into position for imaging. Once an image is captured at step 1110, the image focus is assessed, as indicated at step 1120. Focus assessment can comprise comparison of the image quality with a specified standard or condition, such as the sharpness of contrast at a perceived edge of a feature in the image, or other standards.

Another procedure for performing an autofocus operation using a flatness metric includes the following steps:

1. capturing a gray scale image (i.e., capture an image with the hand held reader and digitize the image using at least two bit resolution, or at least 4 discrete values);
2. optionally sampling the gray scale image (i.e., extract from the image a line or a series of points, or alternatively, the sampled image can be the captured image if it is a windowed frame comprising image data corresponding to selectively addressed pixels);
3. creating a histogram by plotting number of occurrences of data points having a particular gray scale value, for example using the X axis to represent gray scale values and the Y axis to represent frequency of occurrence;
4. processing the histogram to provide a flatness measurement as output;
5. determining a focus level (or quality of focus) based on the flatness measurement; and
6. in the event that the quality of focus as determined from the flatness metric is less than desired, changing the focus and repeating steps 1 through 5.

The flatness of an image refers to the uniformity of the distribution of different gray scale values in the histogram. A flat distribution is one with little variation in numbers of observations at different gray scale values. In general, poorly focused images will be "flatter" than better focused images, i.e. there will be a relatively even incidence of gray scale values over the range of gray scale values. Generally, a histogram for a well focused image has many pixels with high gray scale values, many pixels with low gray scale values, and few pixels in the middle. The use of historical information for various types of images, such as bar codes, including information encoded in look up tables, or information provided using the principles of fuzzy logic, is contemplated At step 1130, the outcome of the focus assessment is compared to an acceptable criterion, such as sharpness (or contrast change) of a specified amount over a specified number of pixels. Images that are digitized to higher digital resolutions (e.g., using a range defined by a larger number of bits) may support more precise determinations of acceptable focus. If the result of the assessment of focus is negative, the process proceeds to step 1140, where the focus of the lens 920 of FIG. 16A, is modified. After adjusting the focus, the operation of the process returns to step 1110, and a new image is captured, and is assessed. When an image is captured that is found to have suitable focus, the process moves from step 1130 to step 1150, wherein the image with suitable focal properties is processed, and a result is made available to a user or to the instrumentality that commanded the capturing of the image, and/or the result is stored in a memory. Optionally, as indicated at step 1160, the system can be commanded to obtain another image, that is to loop back to the step 1110, and to repeat the process again.

Figure 19:
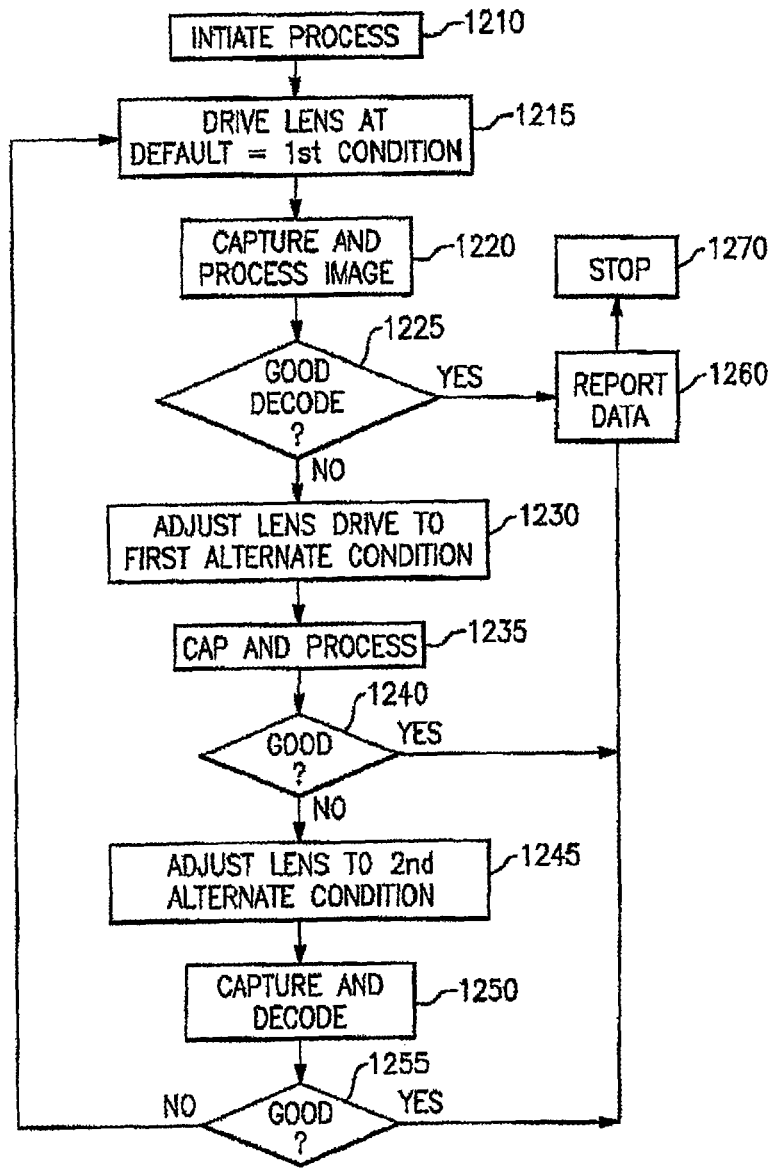
FIG. 19 is a flow chart showing a process for operating a system having an adjustable focus system that does not comprise feedback.

FIG. 19 is a flow chart showing a process for operating a system having an adjustable focus system that does not comprise feedback. At step 1210 a command to capture an image is generated, for example by a user depressing a trigger, or by an automated system issuing a capture image command in response to a specified condition, such as an object being sensed as coming into position for imaging. At step 1215, the lens 920 is driven with a first fluid lens control signal corresponding to a first condition, such as a default condition, for example using a voltage applied to the lens 920 that causes the lens 920 to operate by approximation with focal position q1 of 7 inches. In a preferred embodiment, the applied voltage to focus at 7 inches is zero applied volts. Using this focal condition, an image is captured and processed at step 1220. At step 1225, the information retrieved from the captured image is examined to determine if a valid decoding of a bar code has been achieved. If the decoding is valid, the information or data represented by the decoded image is reported as indicated at step 1260, and the process stops, as indicated at step 1270. A later command to repeat the process can be given as may be necessary or advantageous.

If at step 1225 it is determined that a good decode has not been achieved, the process continues to step 1230, at which time the fluid lens control signal applied to the lens 920 is adjusted to a first alternative value, for example a voltage that causes the lens 920 to focus by approximation at a distance q2 of 30 cm. Using this focal condition, an image is captured and processed at step 1235. At step 1240, the information retrieved from the captured image is examined to determine if a valid decoding of a bar code has been achieved. If the decoding is valid, the information or data represented by the decoded image is reported as indicated at step 1260, and the process stops, as indicated at step 1270.

If at step 1240 it is determined that a good decode has not been achieved, the process continues to step 1245, at which time the fluid lens control signal applied to the lens 920 is adjusted to a second alternative value, for example a voltage that causes the lens 920 to focus by approximation at a distance q3 of 100 cm. Using this focal condition, an image is captured and processed at step 1250. At step 1255, the information retrieved from the captured image is examined to determine if a valid decoding of a bar code has been achieved. If the decoding is valid, the information or data represented by the decoded image is reported as indicated at step 1260, and the process stops, as indicated at step 1270. If a valid decoding of a bar code is still not achieved, the process returns to step 1215, and the process is repeated to try to identify a valid bar code value. In other embodiments, after a specified or predetermined number of iterative loops have occurred without a successful outcome, or after a specified or predetermined time elapses, the process can be aborted by a supervisory control device, which in some embodiments can operate according to a computer program. Alternately the process may stop if the trigger is released. Although the process depicted in FIG. 19 uses three discrete conditions to drive the lens 920 in the search for a suitable focus condition, it is possible to use more or fewer than three predefined drive conditions as components of such a process. For example, one can define a process in which the focal distance changes by a predefined distance, or a predefined percentage. Alternatively, one can define a process in which the adjustment is based upon a quantity determined from the information obtained in assessing whether the captured image is in focus (as described hereinabove) or from the quality of the decoded information (e.g., whether the information is completely garbled or incorrectly formatted, or is close to being valid). In general, the distances specified may not be attained to absolute precision (for example, a distance of 30 cm may not be measured to a precision of 30.000 cm but merely to 30 cm to within one tenth of a centimeter), but rather the test is that the lens operates adequately at the distance that is identified. In the laboratory, precise distances may be set up for experiments, but in actual use in the field, distances are measured less accurately than in the laboratory.

Fluid lenses may have aberrations, such as spherical aberration and/or color aberration. In the focus module of the invention, additional lenses, such as positive or negative lenses, can be used in conjunction with the focus module such as lens 920 to correct one or more of spherical, color, or higher order aberrations. In some embodiments, the materials of construction of the additional lenses can be chosen so as to compensate for optical imperfections and aberrations introduced by the fluid lens.

Figure 22A:
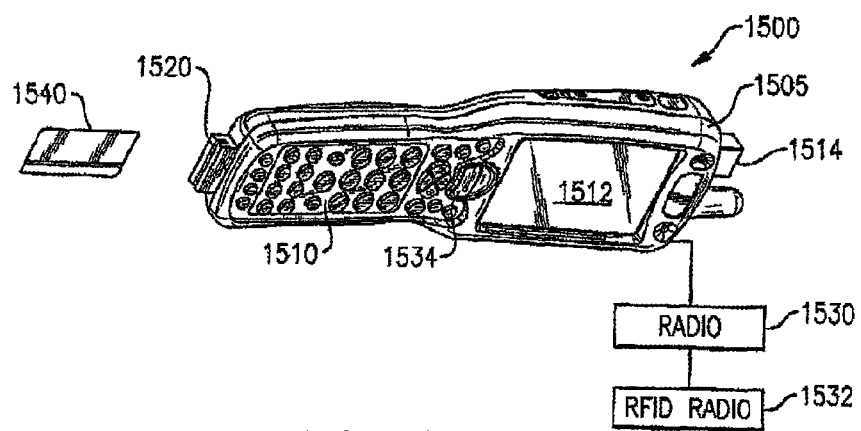
FIGS. 22a and 22b are drawings of hand held readers.
Figure 22B:
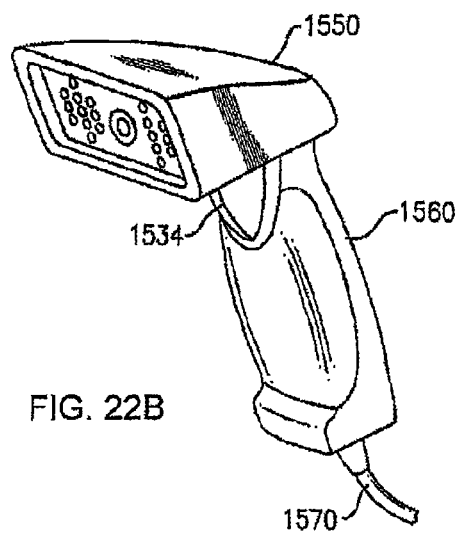

FIGS. 22*a* and 22*b* are drawings of hand held readers that embody features of the invention. FIG. 22*a* shows a hand held reader 1500 comprising a case having a substantially linear shape. The handheld reader 1500 comprises circuitry as has been described with regard to FIG. 17, including data processing capability and memory. The hand held reader 1500 comprises an input device 1510, such as a key pad, for use by a user, one or more buttons of which may also be used as a trigger 1534 to allow a user to provide a trigger signal. The hand held reader 1500 comprises an output device 1512, such as a display, for providing information to a user. In some embodiments, the display 1512 comprises a touch screen to allow a user to respond to prompts that are displayed on the display 1512, or to input information or commands using any of icons or graphical symbols, a simulated keypad or keyboard, or through recognition of handwritten information. Hand held reader 1500 can also comprise a touch pad or touch screen that can display information as an output and accept information as an input, for example displaying one or more icons to a user, and accepting activation of one of the icons by the user touching the touch pad or touch screen with a finger or with a stylus 1508. The hand held reader 1500 also comprises a bar code image engine 1514 that includes a fluid lens. The image engine 1514 acquires images of objects of interest that the hand held reader 1500 is employed to read. The fluid lens provides the ability to adjust a focal distance and to adjust an optical axis of the image engine 1514, as is described in more detail herein. The hand held reader 1500 also comprises a card reader 1520 that is configured in various embodiments to read cards bearing information encoded on a magnetic strip, such as is found on credit cards, and information encoded in a semiconductor memory, such as found in PC, PCMCIA or smart cards. The hand held reader 1500 also comprises a wireless communication device 1530 such as a radio transceiver and/or an infrared transceiver for communication with a remote base station, a computer-based data processing system, a second hand held reader 1500', or a device such as a PDA. The hand held reader 1500 also comprises an RFID transceiver 1532 for communicating with an RFID tag. As used herein, the term "RFID tag" is intended to denote a radio-frequency identification tag, whether active or passive, and whether operating according to a standard communication protocol or a proprietary communication protocol. An RFID transceiver can be programmed to operate according to a wide variety of communication protocols. FIG. 22*a* also depicts a card 1540 that in different embodiments includes information encoded on at least one of a magnetic stripe, a semiconductor memory, smart card, and in RFID tag. An example of a hand held reader 1500 in which such fluid lens systems can be employed is the PDT 9500, available from HandHeld Products, Inc. of Skaneateles Falls, N.Y. In one embodiment, the CMOS image array can be implemented with a Micron image sensor such as the Wide VGA MT9V022 image sensor from Micron Technology, Inc., 8000 South Federal Way, Post Office Box 6, Boise, Id. 83707-0006. The MT9V022 image sensor with full frame shutter is described in more detail in the product MT9V099 product flyer available from Micron Technology (www.micron.com), for example at http://download.micron.com/pdf/flyers/mt9v022_(mi-0350)_flyer.pdf. The ICM105T CMOS progressive imager available from IC Media, 5201 Great America Pkwy, Suite 422, Santa Clara, Calif. 95054 might also be used. The imager is shown at website http://www.ic-media.com/products/view.cfm?product=ICM%2D105T.

This imager uses a rolling shutter. Although both imagers cited are progressive imagers, as is well known in the art, interleaved imagers will also function properly in these systems.

FIG. 22*b* shows another embodiment of a hand held reader 1550 which comprises components as enumerated with respect to hand held reader 1500, including specifically input 1510, output 1512, image engine and fluid lens 1514, card reader 1520, radio 1530, and RFID transceiver 1532. The handheld reader 1550 comprises circuitry as has been described with regard to FIG. 17, including data processing capability and memory. For hand held reader 1550, the case 1560 comprises a "pistol grip" or a portion disposed at an angle, generally approaching 90 degrees, to an optical axis of the imaging engine and fluid lens of the reader 1550. Hand held reader 1550 also comprises a trigger 1534, for example situated on the pistol grip portion of the reader 1550, and located so as to be conveniently operated by a finger of a user. Hand held reader 1550 also comprises a cable or cord 1570 for connection by wire to a base station, a computer-based data processing system, or a point of sale apparatus. Alternately reader 1550 may communicated to a base station by means of an internal radio (not shown). Examples of readers 1550 in which such fluid lens systems can be employed are the IT 4600 comprising a 2D image sensor array, and the IT 5600 comprising a 1D image sensor array, all available from HandHeld Products, Inc. of Skaneateles Falls, N.Y.

In some embodiments, the hand held readers 1500 and 1550 are deployed at a fixed location, for example by being removably secured in a mount having an orientation that is controlled, which may be a stationary mount or a mount that can be reoriented. Examples of such uses are in a commercial setting, for example at a point of sale, at the entrance or exit to a building such as an office building or a warehouse, or in a government building such as a school or a courthouse. The hand held readers of the invention can be used to identify any object that bears an identifier comprising one or more of a bar code, a magnetic stripe, an RFID tag, and a semiconductor memory.

In some embodiments, the hand held reader 1500, 1550 can be configured to operate in either a "decode mode" or a "picture taking" mode. The hand held reader 1500, 1550 can be configured so that the decode mode and picture taking mode are user-selectable. For example, the reader can be configured to include a graphical user interface (GUI) for example on a touch pad or key pad that is both an input and an output device as depicted in FIGS. 22a and 22b enabling a user to select between the decode mode and the picture taking mode. In one embodiment, the decode mode is selected by clicking on an icon displayed on a display such as display 1512 of FIG. 22a whereby the reader is configured with a decode mode as a default. Alternatively, the mode of operation (either "decode mode" or "picture taking mode") can be set by a communication from a remote device, or by default upon initial activation of the reader, as part of a power-up sequence. Thus, the reader is configured to operate in the decode mode on the next (and subsequent) activation of trigger 1534 to generate a trigger signal. In the decode mode, the hand held reader 1500, 1550 in response to the generation of the trigger signal captures an image, decodes the image utilizing one or more bar code decoding algorithms and outputs a decoded out message. The decoded out message may be output, e.g., to one or more of a memory, a display 1512 or to a remote device, for example by radio communication or by a hardwired communication.

In one embodiment, the "picture taking mode" is selected is selected by clicking on icon (which can be a toggle switch). Alternately hand held reader 1500, 1550 is configured in a "picture taking mode" as the default mode. Thus, the hand held reader 1500, 1550 is configured to operate in the "picture taking mode" on the next (and subsequent) activation of trigger 1534 to generate a trigger signal. The hand held reader 1500, 1550 in response to the generation of the trigger signal captures an image and outputs an image to one or more of a memory, to a display 1512, or to a remote device.

The hand held reader 1500, 1550 can be configured so that when the image capture mode is selected, the hand held reader 1500, 1550 avoids attempting to decode captured images. It is understood that in the process of capturing an image for decoding responsively to receipt of a trigger signal, the hand held reader 1500, 1550 may capture a plurality of "test" frames, these may be full frames or only partial frames as discussed above, for use in establishing imaging parameters (e.g., exposure, gain, focus, zoom) and may discard frames determined after decode attempts to not contain decodable symbol representations. Likewise in the process of capturing an image for image output responsively to receipt of a trigger signal in a picture taking mode, the hand held reader 1500, 1550 may capture test frames, these may be full frames or only partial frames as discussed above, for use in establishing imaging parameters and may also discard images that are determined to be unsuitable for output. It is also understood that in the "picture taking mode" the images captured may be archived for later analysis, including decoding of bar codes or other encoded indicia that may be present in the images, for example for use in providing evidence of the condition of a package at the time of shipment from a vendor for insurance purposes (which image may never be decoded if the package arrives safely). Other examples of similar kind can be a photograph of a loaded truck, for example with a license plate, an identifying number or similar indication of which of many possible trucks is the subject of the photograph, optionally including a date and time, and possibly other information that can be stored with the image, such as the identity of the photographer (e.g., a name, an employee number, or other personal identifier).

In an alternative embodiment, the hand held reader 1500, 1550 displays a plurality of icons (at least one for decode mode and one for picture taking mode) whereby activation of an icon both configures the hand held reader 1500, 1550 to operate in the selected operating mode (decoding or picture taking) and results in a trigger signal automatically being generated to commence an image capture/decode (decode mode) or image capture/output image process (picture taking mode). Thus, in the alternative embodiment, the trigger 1534 need not be actuated to commence image capture after an icon is actuated.

Figure 23:
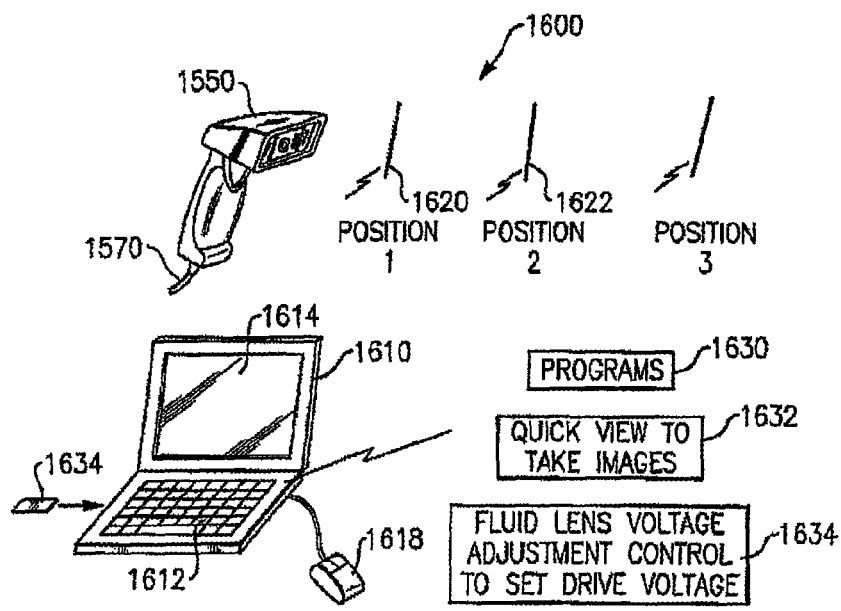
FIG. 23 is a diagram of a handheld reader in communication with a computer.

FIG. 23 is a diagram 1600 of a handheld reader of the invention in communication with a computer. In FIG. 23, a hand held reader 1550 of the type described hereinabove is connected by way of a cable 1570 to a computer 1610, which in the embodiment depicted is a laptop or portable computer. The computer 1610 comprises the customary computer components, including an input 1612, which may include a keyboard, a keypad and a pointing device such as a mouse 1608, an output 1614 for use by a user, such as a display screen, and software 1630 recorded on one or more machine-readable media. Examples of software that operate on the computer 1610 are a program 1632 that provides a quick view of the image as "seen" by the image engine and fluids lens in the hand held reader 1550 on the display 1614 of the computer 1610, and a interactive program 1634, for example provided on a machine readable medium, (not shown) that allows a user to control the signal (such as a voltage or electric potential) applied to the fluid lens and to observe that response of the fluid lens thereto, for example as a representation in a graph or as a representation of one or more images read by the reader as the fluid lens control signal is varied. In FIG. 23, there are also shown a plurality of test targets 1620, 1622, 1624, which in some embodiments are optical test targets conforming to a test target known as the United States Air Force ("USAF") 1951 Target (or 1951 USAF Resolution Target) as shown and described at the web site http://www.sinepatterns.com/US-AF_labels.htm, and provided commercially in a variety of forms by SINE PATTERNS LLC, 1653 East Main Street, Rochester, N.Y. 14609, a manufacturer of the 1951 USAF Target and many other types of targets and visual patterns, as further indicated at the web site http://www.sinepatterns.com/i_Stdrds.htm.

The example depicted in FIG. 23 shows a target at each of three distances or positions relative to the hand held reader 1550. In one embodiment, the three targets lie along a single optical axis at discrete, different distances. In another embodiment, the three targets 1620, 1622, 1624 lie at the same distance along distinct optical axes relative to hand held reader 1550. In some embodiments, both the distances between the hand held reader 1550 and the targets are distinct, and the optical axes from the hand held reader 1550 to the targets are also distinct. Each target 1620, 1622, 1624 presents an object, such as a known test pattern of defined geometry, that the hand held reader 1550 can image. By controlling the behavior of the fluid lens in the hand held reader 1550, it is possible to calibrate the operation of the fluid lens by recording the observed control signal (such as a voltage or impressed electric potential) that is required to obtain an acceptable (e.g., an image within an acceptable range of image quality or one that can be correctly decoded to retrieve information encoded therein), and preferably optimal, image of the target at each location or position.

Figure 24:
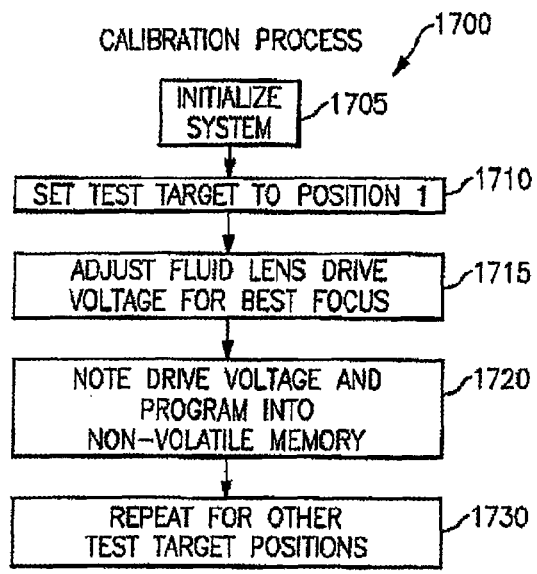
FIG. 24 is a flow chart of a calibration process useful for calibrating apparatus embodying features of the invention.

FIG. 24 is a flow chart 1700 of a calibration process useful for calibrating an apparatus embodying features of the invention. In FIG. 24, the calibration is initiated, as shown at step 1705, by initializing the system, including performing all power-on-sequence tests to assure that the system components are operating properly. At step 1710, a test target bearing a pattern or encoded symbol is positioned at a first test position. When in the first test position, the target will in general be at defined distance and orientation relative to the hand held reader comprising a fluid lens. At step 1715, the fluid lens control signal (which in some embodiments is a voltage) is adjusted to obtain an acceptable, and preferably an optimal, focus condition for the target. At step 1720, the distance and orientation of the target and the fluid lens control signal parameters (for example magnitudes and signs of voltages, timing features of the signal such as pulse duration, transition time and repetition rate) are recorded for future use in a non-volatile memory, for example in a table.

One can iteratively repeat the process steps of locating the target at a new location and orientation, controlling the fluid lens control signal applied to the fluid lens to obtain a satisfactory, and preferably optimal, focus, and recording in a memory the information about the target location and orientation and the fluid lens control signal parameters, so as to provide a more complete and detailed set of calibration parameters. The number of iterations is limited only by the amount of time and effort one wishes to expend performing calibration steps, and the amount of memory available for recording the calibration parameters observed. In the example presented in FIG. 23, a calibration according to the flow diagram of FIG. 24 would include performing calibration steps as described by steps 1710, 1715 and 1720 at three distinct positions for the target. The information obtained in calibration tests can be used when operating the corresponding imager (or in some instances, another imager of similar type) either by using the calibration information as an initial setting for operation in a closed loop mode as explained in connection with FIG. 18, or as fixed operating conditions for discrete points in an open loop operating mode as explained in connection with FIG. 19.

Figure 25:
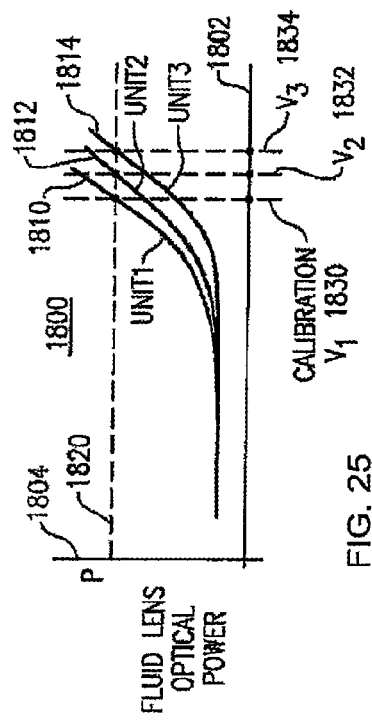
FIG. 25 is a diagram showing calibration curves for a plurality of hand held readers.

FIG. 25 is a diagram 1800 showing calibration curves for a plurality of exemplary hand held readers. In FIG. 25, the horizontal axis 1802 represents a fluid lens control signal parameter, such as voltage, and the vertical axis 1804 represents an optical property of the fluid lens, such as optical power. One can also represent other optical properties of a fluid lens that are relevant for its operation, such as focal length, f-number, and deviation from a default optical axis (which default optical axis may be considered to represent zero degrees of elevation or altitude and zero degrees of azimuth). In FIG. 25, three curves 1810, 1812, 1814 are shown, each curve representing a response (e.g., optical power) of a specific fluid lens to an applied fluid lens control signal (e.g., voltage). As seen in FIG. 25, the curve 1810, representing the behavior of a first fluid lens, reaches an optical power P 1820 at an applied voltage V1 1830. However, other fluid lenses may behave slightly differently, such that a second fluid lens, represented by curve 1812, attains optical power P at an somewhat larger voltage V2 1832, and a third fluid lens, represented by curve 1814, attains optical power P at yet a larger voltage V3 1834. Accordingly, one can extract from the information in FIG. 25 a relation between the fluid lens control signal that is to be applied to the first fluid lens and the second fluid lens to attain the same optical power P, for example for operating two hand held readers under substantially similar conditions, or for operating a binocular reader or other device that uses two fluid lenses simultaneously, for example to generate a stereoscopic view of a target. At power P, there exists a difference in drive voltage between the first lens and the second lens given by V2−V1, where the difference has a magnitude given by the absolute value of V2−V1 and a sign which is positive if V2 exceeds V1 in magnitude, negative if V1 exceeds V2 in magnitude, and zero if V2=V1. In operation, in order to attain optical power P in both of the first and second fluid lenses, one can provide a fluid lens control signal equal to V1 to both the first and second fluid lenses, and a differential signal equal to the signed difference of V2−V1 to the second fluid lens. Alternatively, one could use two power supplies that provide signals V1 and V2 to the first and second fluid lenses, respectively. As the optical power required for operation of a fluid lens changes, the fluid lens control signal changes, and can be deduced or read from the appropriate curve of FIG. 25. Since one in general does not measure the parameters of a fluid lens or other device at all possible values within a range, a curve such as 1810 can also be obtained by measuring a discrete number of pairs of optical parameter and associated fluid lens control signal, and fitting a curve to the data, or interpolating values between adjacent data points, as may be most convenient to prepare a suitable calibration curve. In some instances, only a single calibration point per fluid lens module may be required. Rather than creating curves for different fluid lenses, one can measure the same fluid lens at different temperatures. Then the appropriate operating point can be determined at the various temperatures. Other operating points may be determined by either extrapolation or interpolation, by suitable curve fitting relationships, or by deducing a representation of the behavior in the form of an equation.

Figure 20:
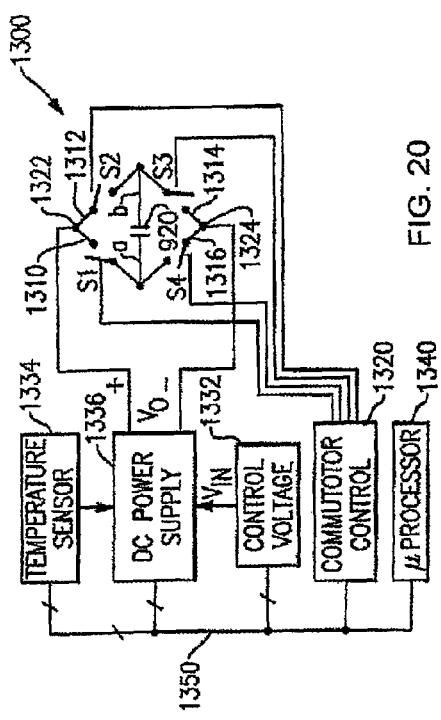
FIG. 20 is a circuit diagram showing a commutating power supply for a fluid lens system.
Figure 21:
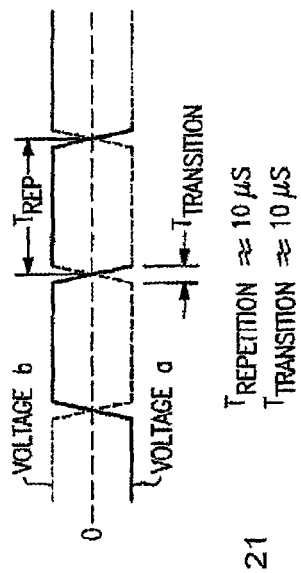
FIG. 21 is a timing diagram showing a mode of operation of the commutating power supply of FIG. 20.
Figure 26:
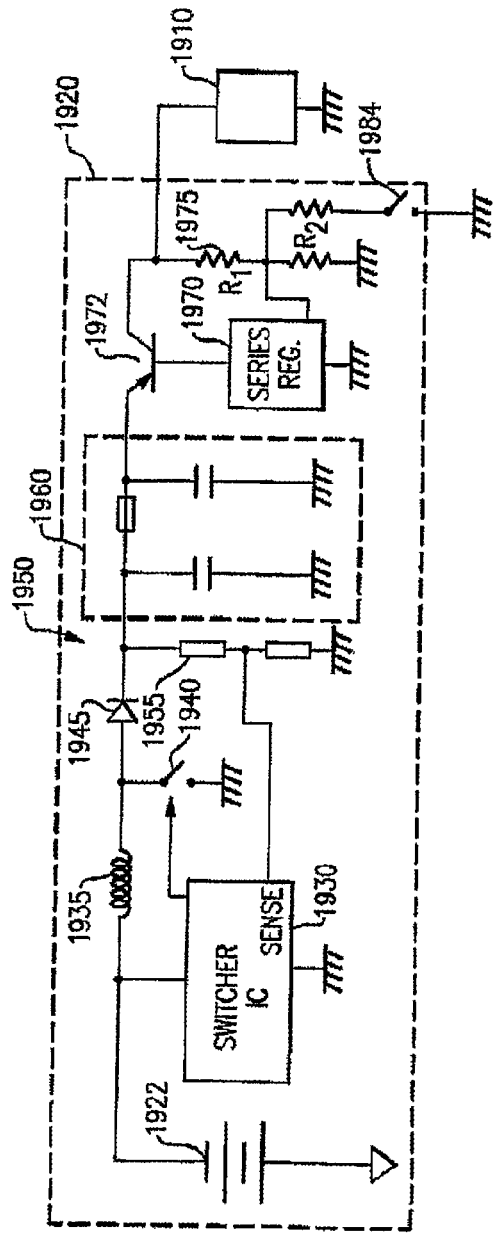
FIG. 26 is a diagram showing an embodiment of a power supply suitable for use with hand held readers.
Figure 27:
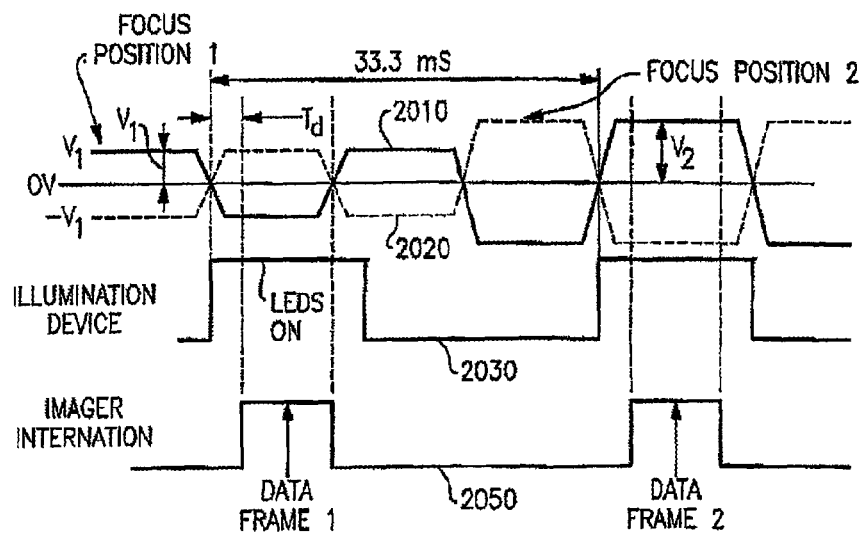
FIG. 27 is a timing diagram illustrating a mode of operation of a hand held reader.

FIG. 26 is a diagram showing an embodiment of a power supply 1900 suitable for use with hand held readers. In general, the first order electrical equivalent circuit for a fluid lens is a simple capacitor. In FIG. 26, a load 1910 represents in one embodiment a capacitive load to a power supply, generally 1920. Because the load is capacitive, the net power consumed is in general small. The power supply 1920 of FIG. 26 is one possible embodiment, which is described first at a high level. The output of this power supply can be used as input to the commutator shown in FIG. 20 comprising switches 1310, 1312, 1314, and 1316. A power source, such as a 6 volt battery 1922, is adequate for operation of the supply. The voltage of the power source may be increased using a DC-to-DC converter comprising a switcher IC 1930 having a sensing terminal, a controller for a switch 1940, (such as a transistor) and an inductor 1935 (which may be provided externally to the switcher). The sense terminal in some embodiments is connected to a voltage divider 1955. A rectifier 1945 is used to provide a unipolar output, which includes noise introduced by the switching operation of the switcher. The output voltage of the first stage of the power supply can be controlled, and in general will be of the order of tens of volts, for example 60V DC. A filter 1960, such as a low pass RC filter, is provided to eliminate noise, as the capacitive elements represent a small impedance as frequency is increased, and represent a large (substantially infinite) impedance to low frequencies. A precision low noise series regulator 1970 is used to control the output voltage for example by controlling a transistor 1972, with a sense input to the series regulator providing a feedback loop through voltage divider 1975. A control 1984 is provided to permit adjustment of the voltage signal applied to the fluid lens, and thereby providing control of a focal distance or plane of focus of the fluid lens 1910. Alternative power supplies that can provide a unipolar output can be used. By using a pair of power supplies (e.g., one providing a positive voltage and one providing a negative voltage), a single power supply and a suitably biased inverter, or by using a single power supply and dual operational amplifiers, one can provide a pair of outputs that are symmetric relative to ground.

Figures 28A, 28B:
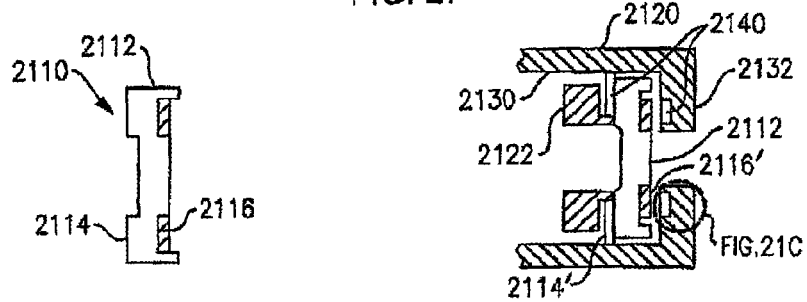
FIGS. 28a-28c are cross-sectional drawings showing a fluid lens with a mount comprising an elastomer for a hand held reader.
Figure 28C:
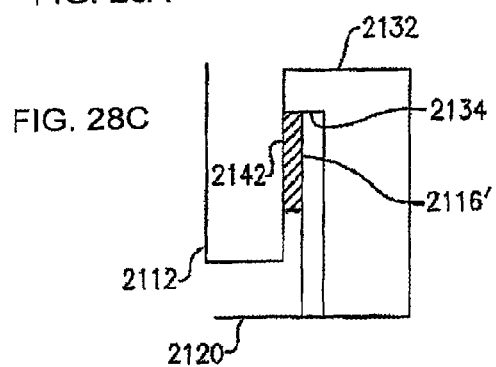

FIGS. 28*a*-28*c* are cross-sectional drawings showing an exemplary fluid lens 2100 with a mount comprising an elastomer for a hand held reader. Such elastomers are made by Chomerics North America, Parker Hannifin Corp., 77 Dragon Court, Woburn, Mass. 01801. In FIG. 28*a*, a fluid lens 2110 is shown with a solid body 2112 in the form of a ring, and electrical contacts 2114, 2116 disposed on opposite sides thereof. In some embodiments, the fluid lens body 2112 is made of metal, and can also represent one of the contacts 2114, 2116, the other contact being insulated from the metal body 2112. In other embodiments, the body 2112 is made from, or comprises, a non-conducting substance.

In FIG. 28*b*, the fluid lens body 2112 is shown mounted in a holder 2120. In one embodiment, the holder 2120 is tubular and has an internally threaded surface 2130 and a partially closed end 2132 having defined therein an aperture of sufficient size not to occlude the optically active portion of the fluid lens. The fluid lens body 2112 is held in place by a threaded retainer ring 2122 that threadedly mates with the internally threaded surface 2130 of the holder 2120. The holder 2120 and retainer ring 2122 are made of an insulating material. In some embodiments, an elastomeric material 2140, 2142 is provided in the form of an "O" ring or an annular washer, so that the fluid lens is supported in a desired orientation, without being subjected to excessive compressive forces or to mechanical disturbances that can be accommodated by the elastomeric ring 2140, 2142. In some embodiments, a single elastomeric ring 2140 or 2142 is provided on one side of the fluid lens body 2120. In some embodiments, one elastomeric ring 2140 is provided on one side of the fluid lens body 2120, and a second elastomeric ring 2142 is provided on the other side of the fluid lens body. Electrical contact with the contacts 2114 and 2116 is provided by wires 2114' and 2116' that contact the respective contacts and which exit the holder. These wires are in intimate electrical contact with the elastomeric material 2122 and 2140. As needed, wires 2114' and 2116' can be insulated. FIG. 28*c* shows the elastomeric washer 2140, which in some embodiments can be conductive, in contact with a fluid lens body 2112 at an electrical contact 2116 thereof, which fluid lens body 2112 is supported in a holder 2120 at a partially closed end 2132 thereof. A wire 2116' contacts the conductive elastomeric washer or ring 2140 and exits the holder 2120 by way of an aperture 2134 defined within the holder 2120. In some embodiments, the wire 2116' contacts the electrical contact of the fluid lens body, and the elastomeric ring or washer is positioned between the wire 2116' and the partially closed end 2132 of the holder 2120. In other embodiments, the wire 2116' is between the elastomer 2140 and the partially closed end 2130. The holder 2120 and threaded ring 2122 can be constructed of any suitable material, and can be non-conductive or conductive as appropriate.

The present invention also deals with the deleterious effects of image smear caused by hand jittering or hand motion in a hand held imager or reader. Image smear has been one of the major sources for image quality degradation. Image smear and similar degradation mechanisms cause a reduced decode rate in a barcode reading application or a reduced contrast and a blurry image in an image capturing application. In some instances, hand jitter or hand motion can cause image degradation that may be severe enough to prevent the image from being processed correctly.

Figure 29:
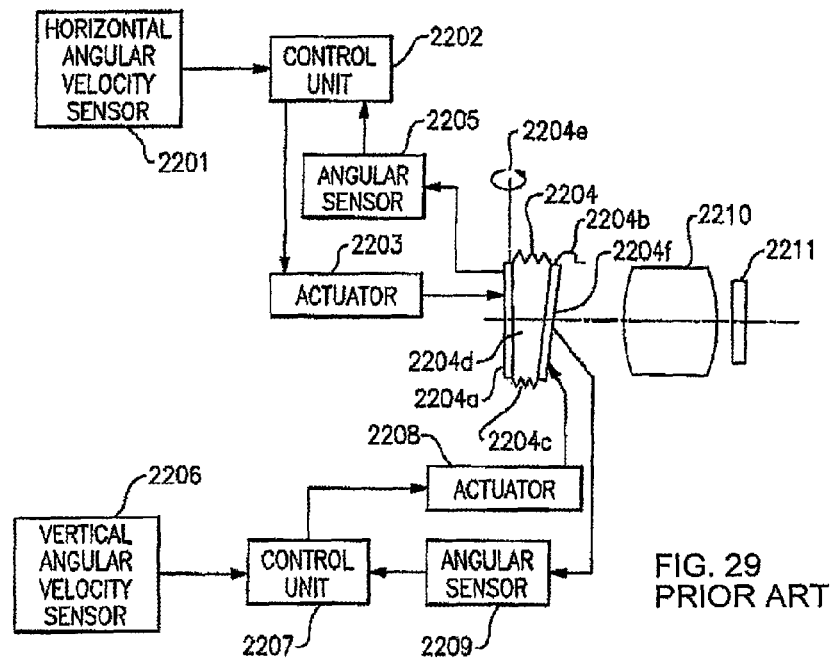
FIG. 29 is a diagram illustrating a prior art variable angle prism.

FIG. 29 is a diagram illustrating a prior art variable angle prism as disclosed in U.S. Pat. No. 6,734,903 to Takeda, et. al. (hereinafter "the '903 patent"). The apparatus disclosed employs two angular velocity sensors, two angular sensors, two actuators and a variable angle prism with a lens system to form an anti-shaking optical system. This type of optical system is widely used in hand held video camcorders to correct the hand jittering effect. However, such systems suffer from a variety of drawbacks, including: 1. higher cost due to many parts; 2. slow response time due to the use of mechanical actuators; 3. lower reliability due to moving parts; 4. the use of a separate auto-focusing electro-mechanical subsystem that further increases the cost and system complexity; and 5. the use of mechanical components that increases the complexity and difficulty of assembly.

The '903 patent describes the operation of the variable angle prism as is expressed in the following 11 paragraphs.

A camera shake is a phenomenon in which photographed images move vertically or horizontally while a user is performing photographing by holding a video camera in his or her hands, since the hands or the body of the user slightly moves independently of the user's intention. Images thus photographed can give a viewer considerable discomfort when reproduced on a television monitor or the like.

To avoid this camera shake phenomenon, conventional video cameras make use of, e.g., a variable angle prism (to be referred to as a "VAP" hereinafter).

A practical example of an arrangement of a conventional image sensing apparatus including a VAP for camera shake correction will be described below with reference to FIG. 29.

In FIG. 29, a VAP 2204 is constituted by coupling two glass plates 2204*a* and 2204*b* via a bellows-like spring member 2204*c* and sealing an optically transparent liquid 2204*d* in the space surrounded by the two glass plates 2204*a* and 2204*b* and the spring member 2204*c*. Shafts 2204*e* and 2204*f* provided in the glass plates 2204*a* and 2204*b* are connected to an actuator 2203 for horizontal driving and an actuator 2208 for vertical driving, respectively. Therefore, the glass plate 2204*a* is rotated horizontally, and the glass plate 2204*b* is rotated vertically.

Note that the VAP 2204 is described in Japanese Patent Laid-Open No. 2-12518 and so a detailed description thereof will be omitted.

A horizontal angular velocity sensor 2201 detects an angular velocity caused by a horizontal motion of the image sensing apparatus resulting from a camera shake or the like. A control unit 2202 performs an arithmetic operation for the detection signal from the angular velocity sensor 2201 such that this horizontal motion of the image sensing apparatus is corrected, and detects and supplies an acceleration component to the actuator 2203. This actuator 2203 drives the glass plate 2204*a* of the VAP 2204 horizontally.

The rotational angle of the glass plate 2204*a* which can be horizontally rotated by the actuator 2203 is detected by an angle sensor 2205. The control unit 2202 performs an arithmetic operation for this detected rotational angle and supplies the result to the actuator 2203.

A vertical angular velocity sensor 2206 detects an angular velocity caused by a vertical motion of the image sensing apparatus resulting from a camera shake or the like. A control unit 2207 performs an arithmetic operation for the detection signal from the angular velocity sensor 2206 such that this vertical motion of the image sensing apparatus is corrected, and detects and supplies an acceleration component to the actuator 2208. This actuator 2208 drives the glass plate 2204b of the VAP 2204 vertically.

The rotational angle of the glass plate 2204b which can be vertically rotated by the actuator 2208 is detected by an angle sensor 2209. The control unit 2207 performs an arithmetic operation for this detected rotational angle and supplies the result to the actuator 2208.

An image sensing optical system 2210 forms an image of an object to be photographed on an image sensor 2211. This image sensor 2211 is constituted by, e.g., a CCD. A two dimensional solid state CCD is used in conventional image sensing apparatuses such as video cameras. An output from the image sensor 2211 is output to a recording apparatus or a television monitor through a signal processing circuit (not shown).

In the conventional image sensing apparatus with the above arrangement, the horizontal and vertical angular velocities caused by a camera shake are detected. On the basis of the angular velocities detected, the actuators move the VAP horizontally and vertically to refract incident light, thereby performing control such that the image of an object to be photographed does not move on the image sensing plane of the image sensor. Consequently, the camera shake is corrected.

In the current invention, a fluid lens provided with additional components to counteract involuntary motions ("an anti-hand-jittering fluid lens") combines the auto-focusing and variable angle prism functionality into a single low cost component that has no moving parts, and that provides fast response time.

Figure 30:
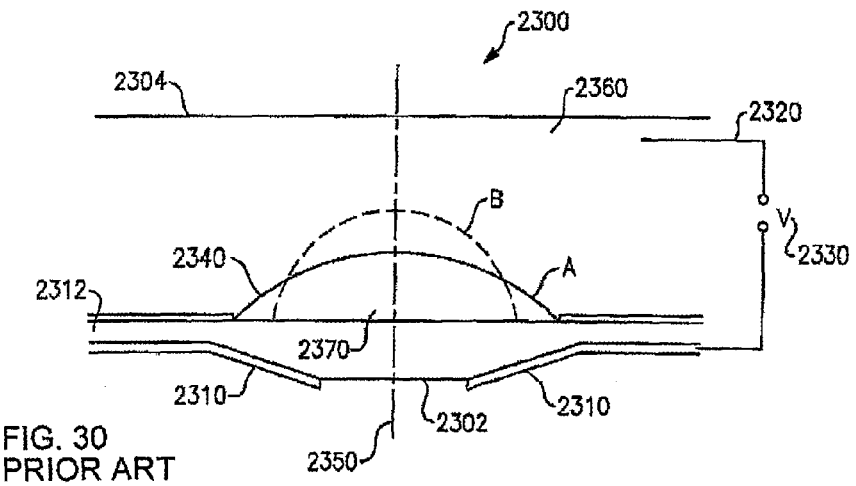
FIG. 30 is a cross-sectional diagram of a prior art fluid lens that is described as operating using an electrowetting phenomenon.

FIG. 30 is a cross-sectional diagram 2300 of a prior art fluid lens that is described as operating using an electrowetting phenomenon. The fluid lens 2300 is a substantially circular structure. The fluid lens comprises transparent windows 2302, 2304 on opposite sides thereof. In FIG. 30, a drop of conductive fluid 2360 (such as water), possibly including dissolved electrolytes to increase conductivity, or to adjust the density of the conductive fluid to match the density of another fluid 2370 that is immiscible with the conductive fluid (such as oil), is deposited on a surface, such as a window. A ring 2310 made of metal, covered by a thin insulating layer 2312 is adjacent the water drop. A voltage difference is applied between an electrode 2320 (that can also be a ring) and the insulated electrode 2310, as illustrated by the battery 2330. In some embodiments, an insulating spacer 2335 (not shown) is located between the rings 2310 and 2320. The voltage difference modifies the contact angle of the liquid drop. The fluid lens uses two isodensity immiscible fluids; one is an insulator (for example oil) while the other is a conductor (for example water, possibly with a salt dissolved therein), which fluids touch each other at an interface 2340. The variation of voltage leads to a change of curvature of the fluid-fluid interface 2340, which in turn leads to a change of the focal length or power of the lens as a result of the refraction of light as it passes from one medium having a first optical index to a second medium having a second, different, optical index. In the embodiment shown, an optical axis 2350 is indicated by a dotted line lying substantially along an axis of rotation of the fluid lens 2300. Although the power of the fluid lens, or its focal length, can change by application of suitable signals to the rings 2310 and 2320, which signals cause the curvature of the interface 2340, in the embodiment shown in FIG. 30 there is no convenient way to cause the optical axis to deviate away from the axis of rotation of the fluid lens in a deliberate manner or by a desired angle.

The current invention uses the principle of altering the interface shape between two fluids and provides another voltage (or other suitable fluid lens control signal) to control an optical tilt of the fluid interface to adjust an exit optical axis angle or direction relative to the fluid lens. One application of such adjustment of the exit optical axis angle is to provide a mechanism and method to compensate the angular movement caused by hand-jittering or hand motion.

Figure 31A:
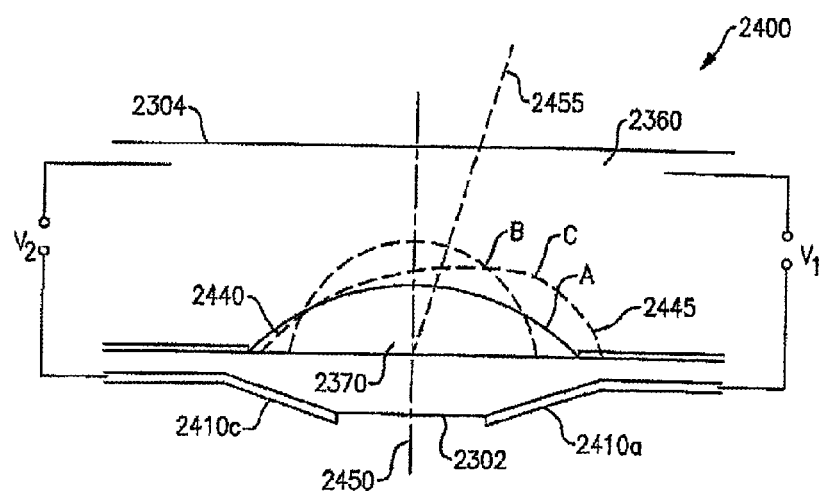
FIG. 31a is a cross sectional diagram 2400 showing an embodiment of a fluid lens configured to allow adjustment of an optical axis.
Figure 31B:
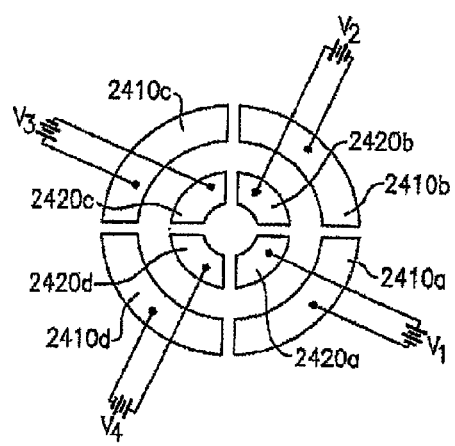
FIG. 31b is a plan schematic view of the same fluid lens.

FIG. 31a is a cross sectional diagram 2400 showing an embodiment of a fluid lens configured to allow adjustment of an optical axis, and FIG. 31b is a plan schematic view of the same fluid lens. FIG. 31b indicates that the two metal ring electrodes 2310, 2320 of the prior art fluid lens shown in FIG. 30 have been divided into a plurality of segments, for example four arc pairs (2410a, 2420a), (2410b, 2420b), (2410c, 2420c) and (2410d, 2420d). A plurality of controllable signal sources, such as voltage sources V1, V2, V3, and V4, are provided, such that each controllable signal source can impress a signal on a selected pair of electrodes independent of the signal applied to any other electrode pair. In order to generate a desired curvature of the fluid interface 2440 in the fluid lens 2400, one can control all four voltage controls V1, V2, V3, and V4 to apply a uniform focusing voltage Vf. In this mode of operation, the fluid lens 2400 functions in exactly the same manner as the prior art fluid lens shown in FIG. 30. However, to generate an optical tilt (or to adjust an optical axis of the fluid lens 2400) using the fluid lens of the current invention, in one embodiment, a horizontal tilt voltage dh and a vertical tilt voltage dv are applied on each of the voltage controls by superimposing the tilt voltages on top of the focusing voltage Vf according to the following equations:

$$V1 = Vf + dv$$

$$V2 = Vf + dh$$

$$V3 = Vf - dv$$

$$V4 = Vf - dh$$

Application of these new signals V1, V2, V3 and V4 creates a two-dimensional tilted fluid lens, in which horizontal and vertical tilt angles are determined according to the magnitudes and signs of the control voltages dh and dv. One can generate such signals involving superposition of a signal Vf and an adjusting signal using well known circuits that are referred to as "summing circuits" in analog circuit design, and by using a digital controller such as a microprocessor-based controller and a digital-to-analog converter to generate suitable fluid lens control signals using digital design principles. In FIG. 24A, fluid lens surface 2445 is shown with a tilt in the vertical dimension caused by application of a signal dv as indicated for V1 and V3. The optical axis 2450 of the undeviated fluid lens is shown substantially along the axis of rotation of the fluid lens, and the deviated or adjusted optical axis is shown by dotted line 2455, which is asymmetric with regard to the axis of rotation. Notice that surface 2445 not only provides focusing curvature to provide a desired optical power of focal length, but also pervades a mechanism to adjust the optical axis to correct for the hand jittering or hand motion. In other embodiments, other applications can be contemplated. As an example, one can set the focal length of the lens to a small value (e.g., operate the lens as a "fisheye" lens that has a wide field of view and great depth of field) and use the adjustment of the optical axis to tip the field of view to bring some feature of interest within the field of view closer to the center of the field of view. In a fisheye lens, features in the center of the field as observed with minimized optical distortions relative to the edge of the field of view, so the object of interest can be observed with reduced distortion. Additionally, a fisheye lens typically spreads out objects at the edge of the field of view, so such operation can increase the number of pixels that the object of interest occupies on a planar image sensor, thereby increasing the detail that may be resolved.

FIG. 32 is a schematic diagram 2500 showing the relationships between a fluid lens and various components that allow adjustment of the optical axis direction. The optical axis control system comprises a horizontal angular velocity sensor 2510, a control module 2512 to generate horizontal tilt voltage dh, a vertical angular velocity sensor 1520, a control module 2522 to generate vertical tilt voltage dv, an auto-focusing control module 2530 to generate a focusing voltage Vf, a distributor module 2540 to synthesize the control voltages to control the fluid lens module 2400 to accommodate or to correct for hand jittering. Alternately when the axis of the optical system changes orientation, the image on the image sensor will move. The processor can extract the magnitude and direction of motion of the object that was not expected to move. This can be used as input to the correction circuit.

In some embodiments, the angular velocity sensors 2510 and 2520 are commercially available low cost solid-state gyro-on-a-chip products, such as GyroChips manufactured by BEI Technologies, Inc., One Post Street, Suite 2500 San Francisco, Calif. 94104. The GyroChip comprises a one piece, quartz micromachined inertial sensing element to measure angular rotational velocity. U.S. Pat. No. 5,396,144 describes a rotation rate sensor comprising a double ended tuning fork made from a piezoelectric material such as quartz. These sensors produce a signal output proportional to the rate of rotation sensed. The quartz inertial sensors are micromachined using photolithographic processes, and are at the forefront of MEMS (Micro Electro-Mechanical Systems) technology. These processes are similar to those used to produce millions of digital quartz wristwatches each year. The use of piezoelectric quartz material simplifies the sensing element, resulting in exceptional stability over temperature and time, and increased reliability and durability.

In other embodiments, it is possible to divide the two metal rings 2410 and 2420 of FIG. 31b into more than four symmetric arc pairs to create more smooth tilt fluid lens. For example, one of the embodiments can have 12 symmetric arc pairs layout in a clock numeric topology. All the system components shown in FIG. 32 will be the same except that the output of distributor 2540 will have 12 voltage control outputs to drive the 12 arc pairs of the fluid lens module. The voltage synthesis algorithm in distributor 2540 is based on the gradient of a (dh, dv) vector. For example, viewing the fluid lens as if it were a clock, (dh, dv)=(2.5, 0) will have a highest voltage output at a pair of electrodes situated at the 3-o'clock position and the lowest voltage output at a pair of electrodes situated at the 9-o'clock position, and no superimposed voltage would be applied to the electrode pairs nearest the 12-o'clock and 6-o'clock positions. It is possible to interpolate the gradient across any intermediate pairs of electrodes around the circle so as to apply a smoothly varying fluid lens control signal. In principle, one could build a fluid lens with as many electrode pairs as may conveniently be provided. In some embodiments, one of the two ring electrodes can be a continuous ring to provide a common reference voltage for all of the pairs, one element of each pair being the continuous ring, which for example might be held at substantially ground potential, for ease of mounting and assembly, if for no other reason.

FIG. 33a is a schematic diagram of an alternative embodiment of a fluid lens 2600, and FIG. 33b is a schematic diagram of an alternative embodiment of a distributor module 2640. In FIG. 33a, there are shown a designed number of symmetric connect points on ring 2610, coupled with a continuous ring 2620. In use, a distributor module 2640 will select a pair of connect points, for example 2612c and 2612i, according to the vector (dh, dv) to apply a tilt voltage tv to the pair of connect points 2612c and 2612i that are disposed symmetrically about a center 2630 of the fluid lens. The voltage signals that will be applied are (Vf+tv, Vf−tv). The tilt voltage tv is a function of (dh, dv) and can be predetermined by a mathematical formula or a lookup table. By selecting a material having suitable conductivity (or resistivity) for the ring 2610, the voltage can be made to drop uniformly from point 2612c to point 2612i along the ring 2610 such that a voltage gradient is created to control a fluid lens having a continuously tilt along the direction of (dh, dv). In principle, the resistivity of the material should be high, so that there is not an appreciable current flowing in the ring 2610, to minimize heating and to permit a low-power power supply or battery to be used. The ring could be produced by applying a thin layer of conductive material on a nonconductive substrate that is prepared with a desired cross sectional shape. For example, one could build a plastic ring 2610 having an inner diameter, and as appropriate, a taper or other shaped surface to match a design criterion, and then coat the surface intended to lie adjacent the fluid with a thin layer of a highly resistive conductor, such as carbon or tantalum, which are commonly used as thin film resistors. Since there is an insulating layer disposed between the conductor and the fluid in any event, the insulating layer could additionally provide mechanical protection for the thin conductive layer.

Figure 34:
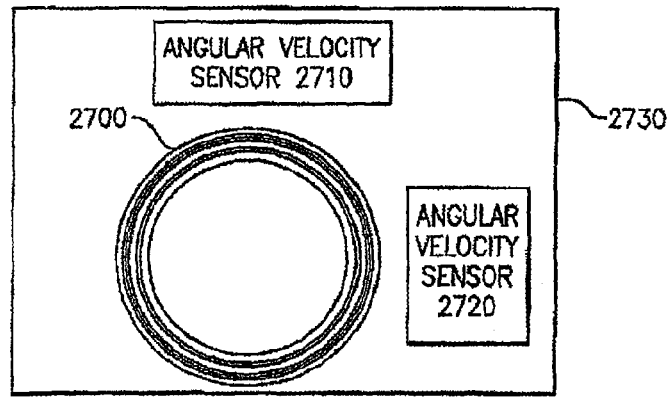
FIG. 34 is a schematic diagram showing the relationship between a fluid lens and a pair of angular velocity sensors.

FIG. 34 is a schematic diagram showing the relationship between a fluid lens 2700 and a pair of angular velocity sensors. In a preferred embodiment, two of the angular velocity sensors 2710, 2720 can be integrated with the fluid lens 2700 to form an integrated module 2730. The angular velocity sensors 2710 and 2720 are arranged in an orthogonal relationship to detect two orthogonal angular velocities. In some embodiments, the entire control circuitry as shown in FIG. 32 can also be integrated into the module 2730. An advantage of this embodiment is ease of mounting the module 2730. No vertical or horizontal alignments are required. The module will automatically adjust the lens tilt angle according to the output voltages dh and dv provided by the angular velocity sensors 2710 and 2720.

Figure 35:
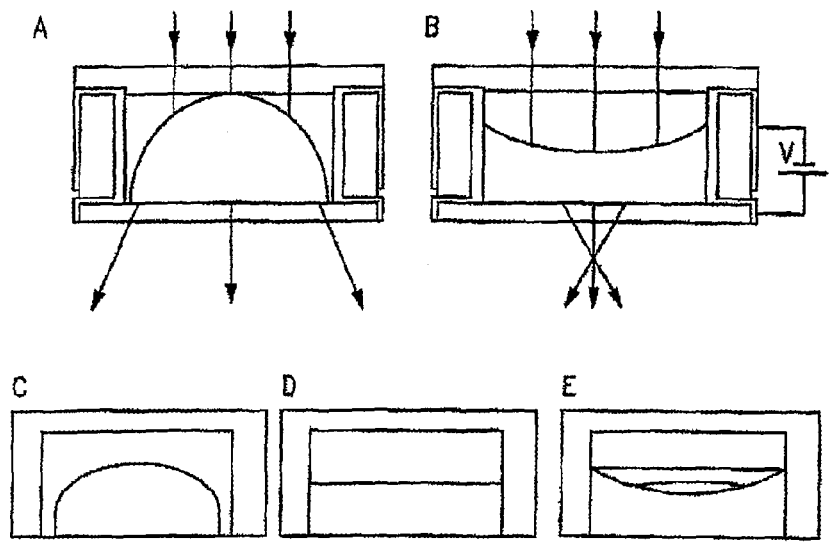
FIGS. 35a-35e are cross-sectional diagrams of another prior art fluid lens that can be adapted for use according to the principles of the invention.

FIGS. 35A-35E are cross-sectional diagrams of another prior art fluid lens that can be adapted for use according to the principles of the invention. FIG. 35A is a cross-sectional view of a prior art fluid lens having no control signal applied thereto and exhibiting divergence of transmitted light. FIG. 35B is a cross-sectional view of a prior art fluid lens having a control signal applied thereto and exhibiting convergence of transmitted light. FIGS. 35C, 35D, and 35E are cross-sectional images of fluid lenses having convex, flat and concave interface surfaces as viewed from a position above each lens, respectively.

In one embodiment, using a device comprising a fluid lens, an image sensor, and a suitable memory, it is possible to record a plurality of frames that are observed using the fluid lens under one or more operating conditions. The device can further comprise a computation engine, such as a CPU and an associated memory adapted to record instructions and data, for example for processing data in one or more frames. The device can additionally comprise one or more control circuits or control units, for example for controlling the operation of the fluid lens, for operating the image sensor, and for controlling sources of illumination. In some embodiments, there is a DMA channel for communicating data among the image sensor, the CPU, and one or more memories. The data to be communicated can be in raw or processed form. In some embodiments, the device further comprises one or more communication ports adapted to one or more of hard-wired communication, wireless communication, communication using visible or infra-red radiation, and communication employing networks, such as the commercial telephone system, the Internet, a LAN, or a WAN.

In this embodiment, by applying suitable selection criteria, one can use or display only a good frame or alternatively a most suitable frame of the plurality for further data manipulation, image processing, or for display. According to this aspect of the invention, the device can obtain a plurality of frames of data, a frame being an amount of data contained within the signals that can be extracted from the imager in a single exposure cycle. The device can assess the quality of each of the frames against a selection criterion, which can be a relative criterion or an absolute criterion. Examples of selection criteria are an average exposure level, an extremum exposure level, a contrast level, a color or chroma level, a sharpness level, a decodability level of a symbol within a frame, and a level of compliance of an image or a portion thereof with a standard. Based on the selection criterion, the device can be programmed to select a best or a closest to optimal frame from the plurality of frames, and to make that frame available for display, for image processing, and/or for data manipulation. In addition, the operating conditions for the device can be monitored by the control circuit, so that the conditions under which the optimal frame was observed can be used again for additional frame or image acquisition.

In alternative embodiments, it is possible to use the plurality of frames as a range finding system by identifying which frame is closest to being in focus, and observing the corresponding focal length of the fluid lens. In such an embodiment, the fluid lens can be operated so as to change its focal length over a range of focal lengths, from infinity to a shortest focal length. The device can obtain one or more frames of data for each focal length that is selected, with the information relating to each focal length being recorded, or being computable from a defined algorithm or relationship, so that the focal length used for each image can be determined. Upon a determination of an object of interest within a frame (or of an entire frame) that is deemed to be in best focus from the plurality of frames, the distance from the device to the object of interest in the frame can be determined from the information about the focal length setting of the fluid lens corresponding to that frame. In some instances, if two adjacent frames are deemed to be in suitable focus, the distance may be taken as the average of the two focal lengths corresponding to the two frames, or alternatively, additional frames can be observed using focal lengths selected to lie between the two adjacent frames, so as to improve the accuracy of the measurement of distance.

In another embodiment, apparatus and methods are provided to counteract changes in the environment that surrounds an apparatus comprising a fluid lens. In one embodiment, the apparatus additionally comprises a temperature sensor with a feed back (or feed forward) control circuit, to provide correction to the fluid lens operating signal as the temperature of the fluid lens (or of its environment) is observed to change.

Feedback systems rely on the principle of providing a reference signal (such as a set point) or a plurality of signals (such as a minimum value and a maximum value for a temperature range) that define a suitable or a desired operating parameter (such as a temperature or a pressure), and comparing a measured value of the parameter to the desired value. When a deviation between the observed (or actual) parameter value and the desired parameter value is measured, corrective action is taken to bring the observed or actual value into agreement with the desired parameter value. In the example of temperature, a heater (such as a resistance heater) or a cooling device (such as a cooling coil carrying a coolant such as water) can be operated to adjust an actual temperature. Using a feedback loop, the apparatus is made to operate at the desired set point, or within the desired range. Feedback loops can be provided using either or both of digital and analog signal processing, and using one or more of derivative, integral and proportional ("D-I-P") controllers.

In some embodiments, a feed-forward system can be used, in which a change (or a rate of change) of a parameter such as actual or observed temperature is measured. Corrective action is taken when it is perceived that a condition outside of acceptable operating conditions likely would be attained if no corrective action were to be applied and the observed change (or rate of change) of the parameter were allowed to continue unabated for a further amount of time. Feed-forward systems can be implemented using either or both of digital and analog signal processing. In some systems, combinations of feedback and feed-forward systems can be applied. In some embodiments, multiple feedback and feed-forward controls can be implemented.

In the embodiment contemplated, the operating parameter, such as temperature, of the apparatus comprising a fluid lens, or of the environment in which it is situated, is monitored, and the observed parameter is compared to one or more predefined values. The one or more predefined values may be fixed (such as a maximum tolerable temperature above which a substance begins to degrade at one atmosphere of pressure) or the one or more predefined values may depend on more than one parameter, such as the combination of pressure and temperature, for example using relationships in a pressure-temperature-composition phase diagram (for example, that a substance or chemical composition in the fluid lens apparatus undergoes a phase change if the pressure and temperature vary such that a phase boundary is crossed, or undergoes a change from covalent to ionic character, or the reverse).

In yet another embodiment, a system comprising a fluid lens additionally comprises a non-adjustable lens component configured to correct one or more specific limitations or imperfections of the fluid lens, such as correcting for color, spherical, coma, or other aberrations of the fluid lens itself or of the fluid lens in conjunction with one or more other optical components. By way of example, a fluid lens may exhibit dispersive behavior or color error. In one embodiment, a second optical element is added that provides dispersion of the sign opposite to that exhibited by the fluid lens, so as to correct the dispersive error introduced by the fluid lens. In one embodiment, the dispersive element is a diffraction element, such as an embossed grating or an embossed diffractive element. As will be understood, different optical materials have different dispersive characteristics, for example, two glass compositions can have different dispersion, or a composition of glass and a plastic material can have different dispersion. In the present invention, a material having a suitable dispersive characteristic, or one made to have suitable dispersive characteristics by controlling the geometry of the material, such as in a grating or other diffractive element, can be used to correct the errors attributable to the fluid lens and/or the other components in an optical train.

The aberrations that are possible in a fluid lens can in principle be of any order, much as the aberrations that are possible in the lens or the cornea of a human eye. Both a human eye and a fluid lens operate using interfaces between two or more dissimilar fluids. In the human eye, there are membranes that are used to apply forces to the fluids adjacent the membranes, by application of muscle power controlled by signals created by the nervous system. In a fluid lens, there are forces that are applied, in some instances, to the fluid or fluids directly by electromagnetic signals and, in some instances, by forces applied to transparent membranes that are adjacent the fluids. Both kinds of systems can be affected by external forces, such as the force of gravity and other accelerative forces, changes in ambient or applied pressure, and changes in ambient or applied temperature.

In still another embodiment, there is provided a calibration tool, process, or method for calibrating a fluid lens. As one example, a system comprising a fluid lens is operated at one or more known conditions, such as one or more magnifications or one or more focal lengths. For each known operating condition, an operating parameter, such as a value of the driving voltage, is observed or measured. The observed or measured data is stored in a memory. The data in memory is then used to provide calibration data for application to the operation of the fluid lens.

Even if two or more nominally identical fluid lenses are provided, there can be differences that exist in the two fluid lenses themselves, as has been explained hereinbefore. When intrinsic differences between two nominally identical fluid lenses exist, application of a substantially identical fluid lens control signal to the two lenses can result in different operative behavior for each lens. A default calibration can be provided, for example based on a calibration performed under controlled or defined conditions. The default calibration data can be recorded and used at a later time to operate the fluid lens for which the calibration was obtained. Using such calibrations is an effective and efficient way to operate a given fluid lens over a defined operating range. For many purposes, such information is well worth having and helps to provide a fluid lens that is conveniently operated in a predictable manner. Between calibration points, interpolation can be used to achieve an improved resolution. Similarly extrapolation may be used to estimate the attributes of a feature beyond the range of measured calibration data.

In addition, as has been indicated, differences may be externally imposed, such as applied voltage, ambient or applied pressure, ambient or applied temperature, and accelerative forces. These forces may, individually and in combination, cause one fluid lens to operate somewhat differently than a nominally identical fluid lens. When such differences in operating conditions exist, application of a substantially identical fluid lens control signal to the two lenses can result in different operative behavior for each lens. Accordingly, it can be helpful to provide a simple and readily applied calibration method for a fluid lens, so that each lens can be calibrated and provided with suitable fluid lens control signals to operate in a desired fashion under the particular conditions pertaining to that fluid lens.

Yet another reason for providing calibration capabilities relates to changes in operation of a given fluid lens over time. The operation of an individual fluid lens relies on one or more of the chemical, mechanical, and electrical properties of the components of the fluid lens, which properties may change with time and with use. For example, as indicated hereinabove, a fluid lens operating in response to electrical signals may undergo electrochemically driven reactions in one or more fluids. In addition, a fluid may change properties over time as a result thermal history, such as of repeated heating and cooling cycles or exposure to extremes of temperature. As will be understood, as a property of one or more components of a fluid lens changes with time, it may be advantageous to calibrate the operating conditions of interest.

In still a further embodiment, an inertial device such as an accelerometer is provided to determine an orientation of a fluid lens, which orientation information is used to self-calibrate the fluid lens. Gravitational and other accelerative forces can cause fluids to move and change shape at a free boundary, or a boundary where two fluids come into mutual contact. By way of example, consider a fluid lens that comprises two fluids having slightly different densities. Different density implies that equal volumes of the two fluids will have proportionately different masses, because density=mass/volume. Therefore, since Force (F)=mass×acceleration, the equal volumes of the two fluids will experience slightly different forces under equal acceleration, such as the acceleration of gravity, or of an external accelerative force applied to a container holding the two fluids. One consequence of such an applied acceleration can be a change in the relative locations of the fluids, and as a result, a change in the shape of the interface defined by the surface of contact between the two fluids. In addition, the direction of application of the acceleration will also have a bearing on the response of the fluids. For example, an acceleration applied normal to a flat interface between the two fluids may have much less of an effect than an acceleration parallel to, or tangent to, a surface component of the interface between the two fluids. Since the accelerative force in general can be applied at any angle with regard to an interface between the two fluids, there will in general be differences in response depending on the precise orientation of the applied accelerative force. Inertial sensors such as accelerometers and gyroscopes can be useful in determining and in tracking the position of an object over time. Through the use of such inertial sensors, it is possible to discern an orientation of an object, and to measure the magnitudes and directions of applied accelerative forces. It is possible to calculate or to model how the fluids present in the lens will respond to the forces operating on the lens with knowledge of the orientation of a fluid lens and of the external forces, including that of gravity. While the description presented hereinabove may be understood to describe linear accelerative forces such as gravity, it is also possible to perform both the tracking and the calculation of the responses of fluids to forces having non-linear components, forces having rotational components, or time-varying forces. In some embodiments, using appropriate sensors for various forces, one can determine the relative orientation of the applied force and the interface between two fluids, and compute what response would be expected. As a result of the computation, information is provided for the timely application of restorative forces. For example, by modifying the magnitude and/or the field direction of an electrical signal, if necessary as a function of time, the expected distortion of the fluid interface can be counteracted. In one embodiment, solid state accelerometer sensors are provided that operate at sufficiently high rates as to determine the magnitude and orientation of an external force. Accelerometers having response rates of at least 10,000 Hz are available from Crossbow Technology, Inc. located at 4145 N. First Street, San Jose, Calif. 95134.

In yet an additional embodiment, in an apparatus comprising a fluid lens, the fluid lens is operated to provide corrective properties with regard to such distortions as may be caused by vibration, location or orientation of the lens, chromatic aberration, distortions caused by higher order optical imperfections, and aberrations induced by environmental factors, such as changes in pressure. As has been explained hereinbefore, using accelerative forces as an example, the fluid lens may in some instances be subjected to various distorting forces or to forces that cause degradation of the operation of the fluid lens from that which is desired. In other instances, the fluid lens may have inherent imperfections, such as chromatic aberration or higher order optical imperfections. It is possible to analyze such optical imperfections in various ways, such as the use of a calibrated imaging system comprising a source, at least one image sensor, and hardware and/or software configured to analyze optical information to assess whether errors or imperfections exist in an optical component under test. The calibrated imaging system in some instances can be a laboratory setting in which highly sophisticated equipment is employed to perform tests. In other instances, the calibrated test system can comprise a source that provides a known optical signal that is passed through an optical component under test, and the analysis of the resulting signal that emerges from the optical component under test. The calibrated test system in some embodiments is a system or device suitable for use in the field, so that periodic calibration can be performed in a convenient and efficient manner, if necessary by personnel who are not familiar with all of the sophistications of optical testing in a laboratory setting.

In one embodiment, the optical component can be modeled in the frequency domain as a transfer function, wherein a known applied input signal I(s) is provided and an observed output signal O(s) is measured. An observed transfer function Hobs(s)=O(s)/I(s) is determined. Hobs(s) can then be compared to a desired transfer function H(s), to determine a corrective factor or relation C(s) that should be applied to the system under test to cause it to perform as desired, where C(s)Hobs(s)=H(s), or C(s)=H(s)/Hobs(s). Once the corrective factor or relation C(s) has been determined, it (or its time domain equivalent) can be applied to drive the fluid lens so as to reduce the observed imperfection or imperfections. Transfer function concepts, discrete time mathematical procedures, digital filters and filtering methods, and circuitry (including hardware and software) that can handle the required detection, analysis and computation, and can be used to apply corrective action are described in many texts on real time digital signal processing. Hardware, such as digital signal processors, is commercially available from multiple vendors.

Applications for fluid lenses include their use in one or more types of camera, such as cameras in cell phones, use in higher quality digital cameras such as those having a high powered zoom lens, and use in cameras that can provide autofocus, and pan, tilt, and zoom ("PTZ"). Panning is moving a camera in a sweeping movement, typically horizontally from side to side. Tilting is a vertical camera movement, e.g. in a direction orthogonal to panning. Commercially available PTZ video and digital cameras that use mechanical redirection of the camera and refocusing of its lens are well known, and are often used in surveillance. In order to accomplish such features as tilt or pan, one needs to reorient the interface between two optically dissimilar fluids so that the optical axis is relocated from its original direction horizontally (pan) or is relocated from its original direction vertically (tilt). With a fluid lens, both relocations can be accomplished in a single redirection of the optical axis at an angle to both the horizontal and vertical directions simultaneously. Such redirections are readily computed using spherical geometry coordinates, but can also be computed in any coordinate system, including using projection from three dimensions to two dimensions, for example as is commonly done in x-ray crystallography as an example. One method to accomplish all of autofocus, pan, tilt, and zoom is to apply several features in a single device. Autofocus and zoom have been addressed hereinbefore. Pan and tilt, or more generally, redirection of the optical axis to a new orientation that is non-collinear with the original optical axis, can be accomplished by providing an electrode pair comprising a first plurality of first electrodes and at least one second electrode, and applying voltages to at least one electrode of the first plurality and the at least one second electrode so that the surface shape of the interface between the two fluids in the fluid lens is caused to change a measure of asymmetry as measured with respect to the optical axis of the fluid lens prior to the application of the voltages. In general, to accomplish the provision of an asymmetry, either the applied voltages will include an asymmetric component, or the electrodes to which the voltages are applied will be positioned in an asymmetric geometrical relationship, or both. By applying a voltage field having an asymmetry to the fluids in the fluid lens, the fluids will respond in a manner to adjust the voltage gradients across the interface to be as uniform as possible, thereby causing the fluids to take up an interface shape that comprises an asymmetric component, and thereby directing light along a new optical axis that is non-collinear with the optical axis that existed prior to the application of the voltage.

We will now briefly describe examples of power supplies that are useful for powering a fluid lens. In one embodiment, a suitable power supply for driving the fluid lens is a square wave power supply that is biased to operate in the range 0 to V volts, where V is either a positive or a negative voltage, which may be thought of as a unipolar supply. One embodiment is to use a bipolar power supply that is capable of providing voltages between +V1/2 and −V1/2 volts, with an added bias voltage of +V1/2 volts (causing the range to extend from 0 volts (=+V1/2 volts bias+[−V1/2 volts] supply) to +V1 volts (=+V1/2 volts bias+V1/2 volts supply), or alternatively using an added bias voltage of −V1/2 volts (causing the range to extend from −V1 volts (=−V1/2 volts bias+[−V1/2 volts] supply) to 0 volts (=−V1/2 volts bias+V1/2 volts supply). The summation of two voltages is easily accomplished with a summing circuit, many variations of which are known. In one embodiment, the bias voltage supply operates at a fixed voltage. In other embodiments, the bias voltage supply is configured to provide a plurality of defined voltages, based on a command, which may be provided by setting a switch, or under the control of a microprocessor. In some embodiments, voltage supplies are used that can be controlled by the provision of a digital signal, such as a digital-to-analog converter controlled by a digital code to define an output signal value. In another embodiment, voltage supplies that are controlled using a frequency-to-voltage converter, such as the National Semiconductor LM2907 or LM 2917 frequency-to-voltage converter, can be employed using a pulse train having a controllable frequency as a control signal. It is believed that electrochemical effects within the fluid lens are operative under sufficiently high applied voltages, thereby making the use of a unipolar supply advantageous in some instances.

In other embodiments, power supplies that provide voltage signals having both positive and negative peak voltages of the order of one volt to hundreds of volts are provided. In some embodiments, the output voltages are provided as square waves that are generated by a driver integrated circuit such as is commonly used to operate electroluminescent lamps, such as are found in cellular telephones.

Figure 36:
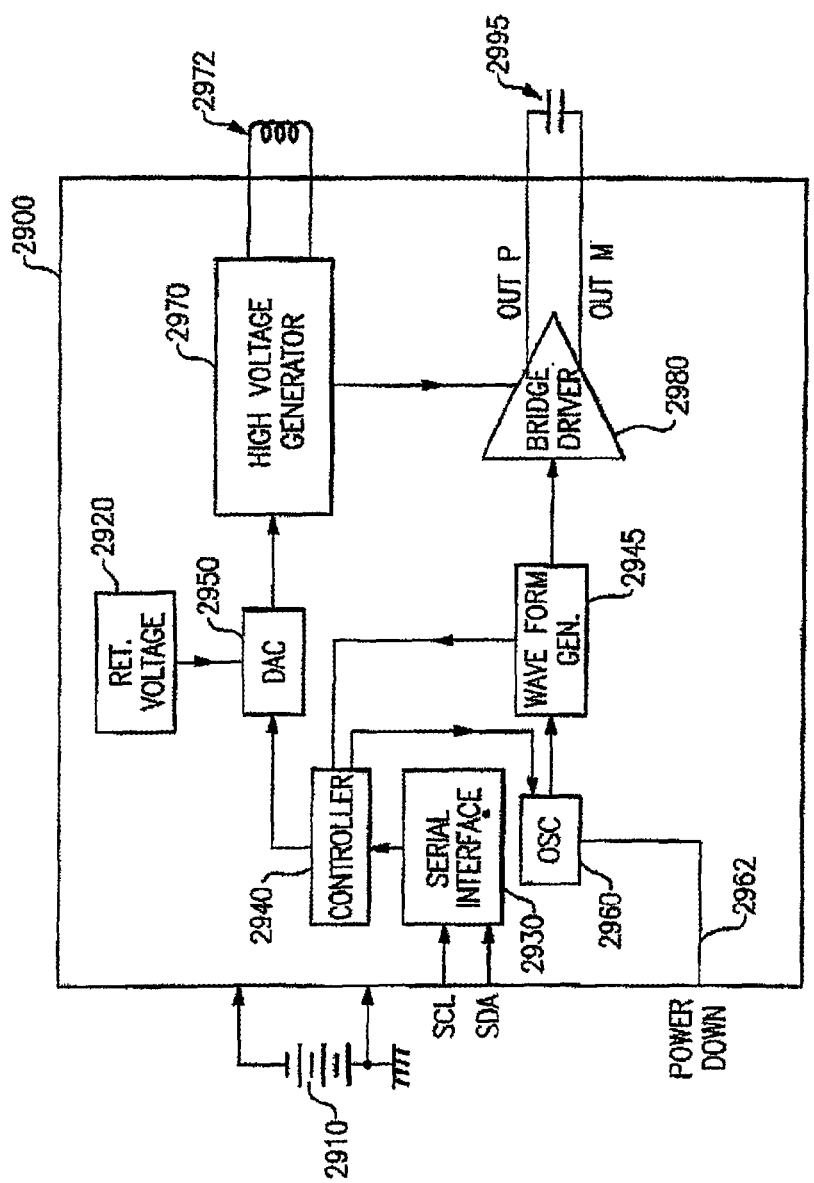
FIG. 36 is a schematic block diagram showing an exemplary driver circuit.

FIG. 36 is a schematic block diagram showing an exemplary fluid lens driver circuit 2900. The circuit is powered by a battery supply 2910, typically operating in the range of 3 to 4.5 volts, although circuits operating with batteries of other voltages and also operating from fixed wall mount power supplies can be designed. A voltage reference 2920 is provided which may have associated with it a low drop out voltage regulator. Input signals in the form of a clock signal (a frequency or a pulse train) and digital data line are provided to an I2C serial interface 2930 for control of this driver circuit by an external device, such as the microprocessor 1040 of FIG. 10. The serial interface 2930 is in communication with a controller 2940 (such as a commercially available microcontroller) for coordinating the activities of the fluid lens driver circuit 2900, the oscillator 2960, to set the output frequency, and a digital-to-analog (DAC) converter 2950, to set the output voltage. The DAC is provided with a reference voltage by the voltage reference 2920. In some embodiments the DAC is a 10 bit DAC.

The controller 2940 is in communication with an oscillator 2960 that provides a timing signal. This oscillator 2960 can be signaled to enter a power down state by a suitable signal communicated from an external source at 2962, which in some embodiments can be a user or can be another controller. The controllers contemplated herein are in general any microprocessor-based controller including a microcontroller, a microprocessor with associated memory and programmed instructions, or a general purpose digital computer. The controller 2940 is also in communication with a wave form generator 2945 that creates the square wave waveform for the bridge driver output stage 2980. The waveform generator 2945 also synchronizes the DAC transitions with the output waveform through the controller 2940.

The output of the DAC 2950 sets the output voltage level of the high voltage generator 2970 such that the output voltage is proportional to the output of the DAC 2920, and thereby is configured to be controlled with high precision by a digital source such as a computer. In some embodiments, appropriate feedback circuitry is contained in this portion of the circuit to keep the output voltage constant over a range of input voltage, load and environmental conditions. The high voltage created by the high voltage generator 2970 is an input to the bridge driver 2980. The high voltage generator has a stable output ranging from 0 Volts to approximately 40 Volts for the Varioptic ASM-1000 fluid lens. This generator may utilize an inductor 2972 and or capacitors to create the higher voltage. However other circuit configurations might also be used, for example capacitive voltage multipliers. The bridge driver 2980 creates the high voltage switching signals OUTP and OUTM which drive the fluid lens 2995. In some embodiments, the output can be applied to a load such as fluid lens 2995 using the commutating circuit of FIG. 20.

The output to the fluid lens is a voltage signal that is waveshaped by the bridge driver using a wave form signal from the wave form generator. The term "bridge driver" should be understood as follows. The load is connected between two amplifier outputs (e.g., it "bridges" the two output terminals). This topology can double the voltage swing at the load, compared to a load that is connected to ground. The ground-tied load can have a swing from zero to the amplifier's supply voltage. A bridge-driven load can see twice this swing because the amplifier can drive either the + terminal of the load or the – terminal, effectively doubling the voltage swing. Since twice the voltage means four times the power, this is a significant improvement, especially in applications where battery size dictates a lower supply voltage, such as in automotive or handheld applications.

As already indicated, one can also sum the output of the circuit described with a reference signal of suitable magnitude and polarity so that the voltage swing experienced by the load is unipolar, but of twice the magnitude of either the positive or negative voltage signal relative to ground. The power advantage just referred to is also present in such an instance, because power P is given by the relationship $V^2/R$ or $V^2/Z$, where V is voltage, R is resistance, and Z is impedance. Since the voltage swing in both embodiments is the same v volts (e.g., from $-v/2$ to $+v/2$, from 0 to $+v$, or from $-v$ to 0), the power available is unchanged. Stated in terms that will be familiar to those acquainted with the principles of electrical engineering, since the reference voltage of an electrical system (for example ground potential) may be selected in an arbitrary manner, merely shifting the voltages applied to the fluid lens from one reference to a different reference should not change the net power delivered to the fluid lens. However, when considered from the perspectives of electrochemical principles, it is recognized that different electrochemical reactions can be made to occur (or can be suppressed) depending on whether an applied electrical signal is a positive-going, or a negative-going, voltage relative to the reference voltage (e.g., polarity may be an important feature in a particular chemical system).

Figure 37A:
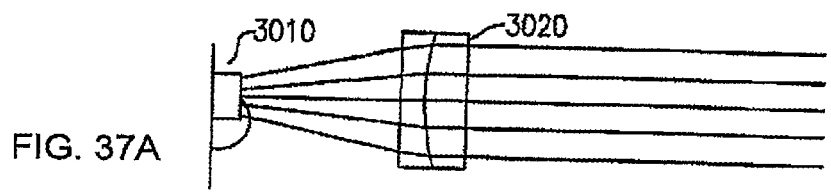
FIGS. 37A and 37 B are diagrams that show an LED die emitting energy in a forward direction through a fluid lens.
Figure 37B:
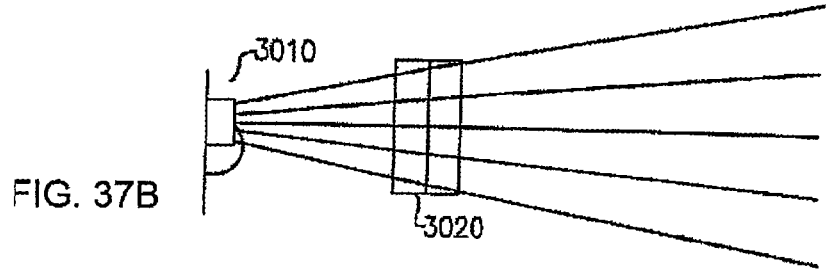

FIGS. 37A and 37B are diagrams that show an LED die 3010 emitting energy in a forward direction through a fluid lens 3020. The divergence of the emitted light is modified with the fluid lens. In FIG. 37A the divergence of the emitted light is modified because of the optical power of the fluid lens. In the example shown the light exiting the fluid lens could be considered to approximate collimated light even though the light exiting the LED is diverging. In a situation where the curvature of the fluid lens is more extreme than is shown in FIG. 37a, the light may be focused on a smaller region. In FIG. 37b the power of the fluid lens has been reduced to approximately zero so that the divergence of the light emitted by the LED is substantially unchanged. The comparison of the light patterns in FIGS. 37A and 37B indicates that such systems can be used to control the coverage (in area) at a target of interest, for example a bar code that one is interested in reading with a hand held reader or imager. In some embodiments, one or more windows on a reader or scanner may also be used to protect the optical system including the fluid lens from adverse environmental conditions.

It should be appreciated that although the details may change, this concept also applies to encapsulated LEDs, as well as to fluid lens assemblies that may contain additional optical elements such as spherical, aspherical and cylindrical lens elements.

In one embodiment, such a system is expected to more efficiently utilize a higher fraction of light emitted by the LEDs. For example when viewing bar code patterns near the imager, a more diverging illumination pattern is desirable in order to be assured that larger bar code patterns are illuminated over their entire extent and when viewing bar code patterns at a larger distance from the imager, a more converging illumination pattern is desirable so that illumination is not wasted by falling outside the optical field of interest.

Figure 38A:
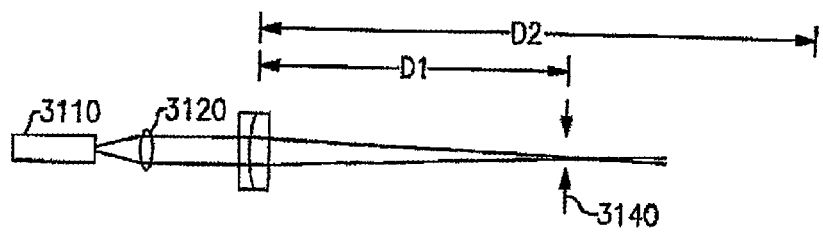
FIGS. 38A, 38B and 38C show diagrams of a laser scanner comprising a laser 3110, a collimating lens 3120, and a fluid lens 3130 in various configurations.
Figure 38B:
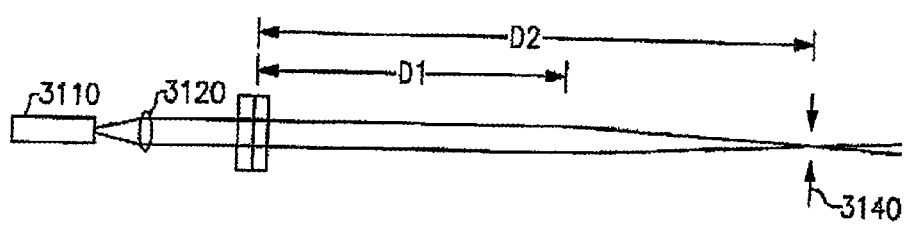
Figure 38C:
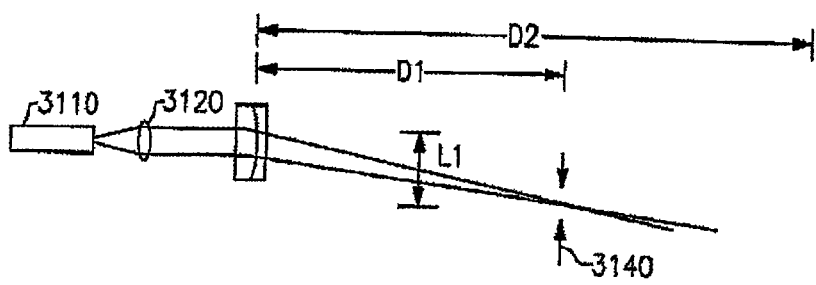

FIGS. 38A, 38B and 38C show diagrams of a laser scanner comprising a laser 3110, a collimating lens 3120, and a fluid lens 3130 in various configurations. In FIG. 38A the fluid lens is configured to have a first optical power, a first focal length and a first principal beam direction. The light beam emanating from the fluid lens 3130 is focused to have a narrowest beam width at a plane 3140 situated at a first distance D1 from the fluid lens 3130. In FIG. 38B the fluid lens is configured to have a second optical power, a second focal length and a first principal beam direction. In FIG. 38B, the light beam emanating from the fluid lens 3130 is focused to have a narrowest beam width at a plane 3141 situated at a second distance D2 from the fluid lens 3130, such that D2 is greater than D1, and the first principal beam direction is not changed when the focal length of the fluid lens 3130 is changed. In FIG. 38C the fluid lens is configured to have a first optical power, a first focal length and a second principal beam direction. In FIG. 38C, the light beam emanating from the fluid lens 3130 is focused to have a narrowest beam width at a plane 3140 situated at a first distance corresponding to a distance D1 from the fluid lens 3130 measured along the second principal beam direction of FIG. 38A, but because the beam in FIG. 38C is emanating at an angle (e.g., the third principal beam direction is not the same as the first principle beam direction), the lateral distance that the beam is "off-axis" is L1. Other optical powers, focal lengths and principle beam directions can be achieved by properly configuring and energizing the fluid lens 3130.

The present inventions are intended to take advantage of fluid lens zoom optical systems. Fluid Zoom lens configurations can be used in bar code scanners to enable imaging of different bar codes at various distances from the bar code scanner. In bar code scanners manufactured today, often a large working distance is achieved by stopping down the lens aperture to increase the optical depth of field. However this has two disadvantages: First, when the lens stop is smaller, the optical system point spread function increases thereby making it more difficult to scan bar code patterns with narrow bar code elements. Second, when the lens stop is smaller, less light enters the lens thereby reducing the signal-to-noise ratio of the system. The lower SNR requires the operator to hold the reader still for longer period of time. The effect is that the bar code scanner has an increased sensitivity to hand motion. In addition, because longer periods of time are required, the user is more likely to become fatigued.

According to one embodiment, a sketch of zoom lens configuration 3200 is shown in FIG. 32. The object 3202 is imaged with lens assembly 3204 onto the image plane 3206. This zoom lens makes use of 3 fluid lenses 3210, 3220 and 3230. The lens system 3200 images three object points 3240, 3242 and 3244 onto the image plane 3206 at the respective points 3254, 3252 and 3250 respectively. Observe that because the image locations are not resolved in this figure, the individual image points cannot be seen. The details of zoom lens 3204 are shown in more detail in FIG. 33 and this figure show each of the lens surfaces called out for all elements except the fluid lens elements that are shown in the detail of FIG. 34.

Object distance measurements can be made if the range of, or the distance to, the object is known. A fluid lens system can be used to implement a range finding system. In one embodiment, the fluid lens would be focused at a number of focus positions and the position with the best focus, as determined by any of a number of metrics, would be associated with that fluid lens position. By knowing the fluid lens drive voltage that caused the fluid lens to have an optimally focused image, and using a look-up table, the associated distance from the system for that specific fluid lens operating voltage can be determined. By knowing the range, the magnification can be calculated and thus the object width associated with a given number of pixels at the imager is known or can be deduced. In this way a system such as a bar code reader or imager can calculate the width of specific object features, such as bar code element widths or the dimensions of a package.

A fluid lens variable aperture can be added to a bar code system. In some embodiments, the aperture would be used in the portion of the optical system that receives light and would allow the system to optimally trade light efficiency against point spread function width and depth of field. When a small aperture is used, the optical system will have a larger depth of field, but adversely the optical throughput of the system is reduced (i.e., less light gets through the system) and the point spread function (proportional to the minimal element size that can be resolved) is also reduced. In some embodiments, a bar code system is expected to be configured to initially have the optical system set for an optimum light throughput, and if a good read is not achieved then the aperture size could be reduced in order to extend the depth of field in an effort to decode any bar code pattern that may be within the bar code scanner field of view.

In one embodiment, a fluid lens is used as a variable aperture. FIG. 43 is a diagram 4300 showing an illustrative variable aperture comprising a fluid lens. One implementation of this use of a fluid lens involves adding a colorant to at least one of the fluids to make that fluid opaque in at least a region of an electromagnetic spectral range of interest, such as being opaque at a specified range in the visible spectrum. Voltage is applied to the lens from a power supply 4350 such that the fluid lacking the colorant that absorbs in the specified region "bottoms" against the opposite window, thereby forming a clear aperture in that spectral range of interest. An example is shown in FIG. 43, where the colorant has been added to the water component 4310 of an oil 4320/water 4310 fluid lens. The fluid lens 4300 comprises metal electrodes 4302, 4304 separated by an insulator 4306, and has a window 4330 opposite the window 4340 to allow light to pass through the fluid lens 4300.

In an alternate embodiment, if the left window 4340 in FIG. 43 is curved such that it is effectively parallel to the curve of the water-oil interface, the liquid lens can in some instances be configured to perform as a variable filter. In such an embodiment, the oil would not bottom against the opposite window, but would produce a thickness of the water that is essentially constant as a function of radius across a portion of the window. This thickness would be varied by varying the applied voltage. The voltage-controlled thickness of the light-absorbing water would thereby determine the amount of light passing through the fluid filter. If the colorant has light absorbing characteristics in specific wavelengths, then the amplitude of the light in these wavelengths passing through the fluid filter would be varied by varying the applied voltage.

By having more than one lens element configured as a fluid lens, for example a lens triplet, the optical aberrations present in a single element can be reduced for the assemblage of lenses and this would result in a higher quality optical image. The techniques for optimizing a triplet are well known in the lens design art. However, it is typically the case that any given lens is optimized for a given focal length system. Typically, if a lens is optimized for one combination of optical elements, it is not optimally configured when one of the lens surfaces is changed as would happen when a single fluid element is operated to change an optical parameter, such as a focal length. By adding a second fluid lens, the combination of the first lens and the second lens can be optimized to minimize total system aberrations. For different settings of the first lens, corresponding changes in the settings of the second lens can be made to obtain an optimal combination. These optimized relationships between the two fluid lens surfaces curvatures, i.e. surface optical power, and thus also the control voltages, can be contained for example in a table that is recorded in a machine readable memory. Thus for any given setting of desired system optical power, the appropriate drive voltages for the two fluid lenses can be developed, and applied in accordance with the recorded values. Where desirable or advantageous, the fineness of the table resolution may be increased through use of linear or higher order interpolation and extrapolation.

Other prior art fluid lens systems that operate using mechanical forces to control the shape and properties of a fluid lens are described in U.S. Pat. No. 4,514,048 to Rogers, which has already been incorporated herein by reference in its entirety. Additional disclosure relevant to variable focus lenses is presented in the following U.S. Pat. No. 2,300,251 issued Oct. 17, 1942 to Flint, No. 3,161,718 issued Dec. 15, 1964 to DeLuca, No. 3,305,294 issued Feb. 21, 1967 to Alvarez, and No. 3,583,790 issued Jun. 8, 1971 to Baker, all of which are hereby incorporated by reference herein in their entirety.

Machine-readable storage media that can be used in the invention include electronic, magnetic and/or optical storage media, such as magnetic floppy disks and hard disks; a DVD drive, a CD drive that in some embodiments can employ DVD disks, any of CD-ROM disks (i.e., read-only optical storage disks), CD-R disks (i.e., write-once, read-many optical storage disks), and CD-RW disks (i.e., rewriteable optical storage disks); and electronic storage media, such as RAM, ROM, EPROM, Compact Flash cards, PCMCIA cards, or alternatively SD or SDIO memory; and the electronic components (e.g., floppy disk drive, DVD drive, CD/CD-R/CD-RW drive, or Compact Flash/PCMCIA/SD adapter) that accommodate and read from and/or write to the storage media. As is known to those of skill in the machine-readable storage media arts, new media and formats for data storage are continually being devised, and any convenient, commercially available storage medium and corresponding read/write device that may become available in the future is likely to be appropriate for use, especially if it provides any of a greater storage capacity, a higher access speed, a smaller size, and a lower cost per bit of stored information. Well known older machine-readable media are also available for use under certain conditions, such as punched paper tape or cards, magnetic recording on tape or wire, optical or magnetic reading of printed characters (e.g., OCR and magnetically encoded symbols) and machine-readable symbols such as one and two dimensional bar codes.

Many functions of electrical and electronic apparatus can be implemented in hardware (for example, hard-wired logic), in software (for example, logic encoded in a program operating on a general purpose processor), and in firmware (for example, logic encoded in a non-volatile memory that is invoked for operation on a processor as required). The present invention contemplates the substitution of one implementation of hardware, firmware and software for another implementation of the equivalent functionality using a different one of hardware, firmware and software. To the extent that an implementation can be represented mathematically by a transfer function, that is, a specified response is generated at an output terminal for a specific excitation applied to an input terminal of a "black box" exhibiting the transfer function, any implementation of the transfer function, including any combination of hardware, firmware and software implementations of portions or segments of the transfer function, is contemplated herein.

There is set forth herein:

A1. A focus module comprising:
 a) a boundary element;
 b) a focus element, said focus element further comprising
  i) a fluid, and
  ii) a deformable membrane,
  said fluid being entrapped between said boundary element and said deformable membrane; and
 c) a pressure element;
 wherein said pressure element is capable of deforming said focus element by pressing on said deformable membrane in the direction of said boundary element.

B1. A focus module, comprising:
 d) a boundary element;
 e) a focus membrane;
 f) a focus fluid entrapped between said boundary element and said focus membrane; and
 g) a deforming element contacting said focus membrane.

C1. A focus module, comprising:
 h) a boundary element;
 i) a spacer element;
 j) a focus membrane;
 k) a focus fluid entrapped between said boundary element and said focus membrane; and
 l) a deforming element contacting said focus membrane.

D1. A focus module, comprising:
 m) a cylinder having
  i) a top surface,
  ii) a bottom surface,
  iii) an outer wall, and
  iv) a fluid interior volume therewithin; and
 n) a deforming element external to said cylinder, said deforming element being capable of exerting pressure on said top surface, thereby deforming said top surface.

E1. A focus module, comprising, in order:
 o) a boundary element;
 p) a focus element; and
 q) a deforming element.

E2. The focus module of E1, wherein said deforming element is in direct contact with said focus element.

E3. The focus module of E1, wherein said deforming element acts on said focus element through at least one intermediary element.

E4. The focus module of E3, wherein said at least one intermediary element comprises a pressure element.

E5. The focus module of E4, wherein said deforming element presses on said pressure element and said pressure element is in contact with said focus element, thereby transmitting force to said focus element.

While the present invention has been particularly shown and described with reference to the structure and methods disclosed herein and as illustrated in the drawings, it is not confined to the details set forth and this invention is intended to cover any modifications and changes as may come within the scope and spirit thereof.

The invention claimed is:

1. An optical system comprising:
 an illumination assembly for generating light to illuminate a target;
 an image sensor for converting light reflected from the target into electrical signals;
 a focus module for focusing light reflected from the target onto the image sensor, the focus module comprising:
  a boundary element;
  a focus membrane; and
  a focus fluid entrapped between the boundary element and the focus membrane;
 a deforming element in communication with the focus module, the deforming element comprising:
  a ring shaped structure; and
  a plurality of tabs extending inward from the ring shaped structure for applying a force to the focus membrane to change the focus membrane's curvature by curling in the direction of the focus membrane; and
 a lens controller coupled to the deforming element for providing a control signal to the deforming element to vary the force applied to the focus membrane.

2. The optical system of claim 1, wherein the deforming element is in direct contact with the focus membrane.

3. The optical system of claim 1, wherein a tab of the plurality of tabs comprises a first polymer layer and a second polymer layer.

4. The optical system of claim 1, wherein the deforming element applies a force in a direction substantially parallel to the focus membrane.

5. The optical system of claim 1, comprising an inelastic element for positioning the deforming element relative to the focus membrane.

6. The optical system of claim 1, comprising a first circuit and a second circuit, wherein:
the plurality of tabs comprises a first tab controlled by the first circuit and a second tab controlled by the second circuit; and
the first circuit and the second circuit are independent such that the first tab and the second tab apply forces to the focus membrane to make the focus membrane's curvature asymmetric.

7. A device comprising:
an image sensor for converting light into electrical signals;
a focus module for focusing light onto the image sensor, the focus module comprising;
a boundary element;
a focus membrane; and
a focus fluid entrapped between the boundary element and the focus membrane;
a deforming element in communication with the focus module, the deforming element comprising:
a ring shaped structure; and
a plurality of tabs extending inward from the ring shaped structure for applying a force to the focus membrane to change the focus membrane's curvature; and
a lens controller coupled to the deforming element for providing a control signal to the deforming element to vary the force applied to the focus membrane.

8. The device of claim 7, wherein the plurality of tabs curl in the direction of the focus membrane to apply the force.

9. The device of claim 7, wherein the deforming element is in direct contact with the focus membrane.

10. The device of claim 7, wherein a tab of the plurality of tabs comprises a first polymer layer and a second polymer layer.

11. The device of claim 7, wherein the deforming element applies a force in a direction substantially parallel to the focus membrane.

12. The device of claim 7, comprising an inelastic element for positioning the deforming element relative to the focus membrane.

13. The device of claim 7, comprising a first circuit and a second circuit, wherein:
the plurality of tabs comprises a first tab controlled by the first circuit and a second tab controlled by the second circuit; and
the first circuit and the second circuit are independent such that the first tab and the second tab apply forces to the focus membrane to make the focus membrane's curvature asymmetric.

14. A data collection device comprising:
a focus module capturing light reflecting from a target, the focus module comprising;
a boundary element;
a focus membrane; and
a focus fluid entrapped between the boundary element and the focus membrane;
a deforming element in communication with the focus module, the deforming element comprising:
a ring shaped structure; and
a plurality of tabs extending inward from the ring shaped structure for applying a force to the focus membrane to change the focus membrane's curvature; and
a lens controller coupled to the deforming element for providing a control signal to the deforming element to vary the force applied to the focus membrane.

15. The data collection device of claim 14, wherein the plurality of tabs curl in the direction of the focus membrane to apply the force.

16. The data collection device of claim 14, wherein the deforming element is in direct contact with the focus membrane.

17. The data collection device of claim 14, wherein a tab of the plurality of tabs comprises a first polymer layer and a second polymer layer.

18. The data collection device of claim 14, wherein the deforming element applies a force in a direction substantially parallel to the focus membrane.

19. The data collection device of claim 14, comprising an inelastic element for positioning the deforming element relative to the focus membrane.

20. The data collection device of claim 14, comprising a first circuit and a second circuit, wherein:
the plurality of tabs comprises a first tab controlled by the first circuit and a second tab controlled by the second circuit; and
the first circuit and the second circuit are independent such that the first tab and the second tab apply forces to the focus membrane to make the focus membrane's curvature asymmetric.

* * * * *